(12) United States Patent  (10) Patent No.: US 8,749,932 B2
Tanaka et al.  (45) Date of Patent: *Jun. 10, 2014

(54) SEMICONDUCTOR DEVICE WITH A PLURALITY OF POWER SUPPLY SYSTEMS

(75) Inventors: Masanori Tanaka, Kanagawa (JP); Morihisa Hirata, Kanagawa (JP); Hitoshi Okamoto, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/586,214

(22) Filed: Aug. 15, 2012

(65) Prior Publication Data

US 2012/0307408 A1  Dec. 6, 2012

Related U.S. Application Data

(63) Continuation of application No. 12/929,206, filed on Jan. 7, 2011, now Pat. No. 8,270,132, which is a continuation of application No. 11/656,447, filed on Jan. 23, 2007, now Pat. No. 7,869,174.

(30) Foreign Application Priority Data

Jan. 24, 2006 (JP) ................................ 2006-015146

(51) Int. Cl.
 *H02H 9/00* (2006.01)
(52) U.S. Cl.
 USPC .......................................................... 361/56
(58) Field of Classification Search
 USPC .......................................................... 361/56
 See application file for complete search history.

(56) References Cited

U.S. PATENT DOCUMENTS

| 5,886,558 | A | 3/1999 | Iijima et al. |
| 6,002,568 | A | 12/1999 | Ker et al. |
| 6,011,681 | A | 1/2000 | Ker et al. |
| 6,075,686 | A | 6/2000 | Ker |
| 6,147,538 | A | 11/2000 | Andresen et al. |

(Continued)

FOREIGN PATENT DOCUMENTS

| JP | 09-172146 A | 6/1997 |
| JP | 2005-184623 A | 7/2005 |
| JP | 2006-156563 A | 6/2006 |

OTHER PUBLICATIONS

Japanese Office Action dated Feb. 7, 2012 with partial English Translation.

(Continued)

*Primary Examiner* — Scott Bauer
(74) *Attorney, Agent, or Firm* — McGinn IP Law Group, PLLC

(57) ABSTRACT

A protection circuit includes a first power supply system including a first power supply and a first ground, a second power supply system including a second power supply and a second ground, and a control circuit that, when coupled to an electro-static discharge (ESD) stress being applied to the first power supply system, controls a first switch. The first switch is provided between the signal line and the first ground. The control circuit includes a capacitance element, a resistance element in series with the capacitance element, and an inverter, an output of the inverter being connected between a gate of the first switch, an input of the inverter being connected to a connecting point between the capacitance element and the resistance element.

2 Claims, 26 Drawing Sheets

(56) References Cited

U.S. PATENT DOCUMENTS

| | | |
|---|---|---|
| 6,624,992 B1 | 9/2003 | Aparin |
| 6,803,632 B2 * | 10/2004 | Kato .............................. 257/357 |
| 7,692,907 B2 | 4/2010 | Chen et al. |
| 7,869,174 B2 | 1/2011 | Tanaka et al. |
| 2002/0066929 A1 | 6/2002 | Voldman |
| 2002/0084490 A1 | 7/2002 | Ker et al. |
| 2002/0140489 A1 | 10/2002 | Maloney et al. |
| 2004/0120087 A1 * | 6/2004 | Ishii ................................ 361/56 |
| 2005/0135033 A1 | 6/2005 | Kitagawa et al. |
| 2006/0050454 A1 * | 3/2006 | Koudate et al. ................ 361/56 |
| 2006/0114047 A1 | 6/2006 | Irino |
| 2006/0262472 A1 * | 11/2006 | Okushima .................... 361/91.1 |
| 2007/0085144 A1 | 4/2007 | Chen |
| 2008/0062597 A1 | 3/2008 | Chen et al. |

OTHER PUBLICATIONS

United States Office Action dated Apr. 29, 2010 in U.S. Appl. No. 11/656,447.
United States Office Action dated Oct. 7, 2009 in U.S. Appl. No. 11/656,447.
United States Office Action dated Feb. 27, 2009 in U.S. Appl. No. 11/656,447.
United States Office Action dated Apr. 3, 2008 in U.S. Appl. No. 11/656,447.
United States Office Action dated Feb. 16, 2012 in U.S. Appl. No. 12/929,206.
United States Office Action dated Oct. 17, 2011 in U.S. Appl. No. 12/929,206.
United States Office Action dated Apr. 1, 2011 in U.S. Appl. No. 12/929,206.

* cited by examiner

SEMICONDUCTOR DEVICE WITH A PLURALITY OF POWER SUPPLY SYSTEMS

RELATED APPLICATIONS

The present application is a Continuation application of U.S. patent application Ser. No. 12/929,206, filed on Jan. 7, 2011, now U.S. Pat. No. 8,270,132 which is a Continuation of U.S. patent application Ser. No. 11/656,447, filed on Jan. 23, 2007, now U.S. Pat. No. 7,869,174 B2.

FIELD OF THE INVENTION

The present invention relates to a semiconductor device. More specifically, the invention relates to a device suitable for being applied to a semiconductor integrated circuit device including a plurality of power supply systems.

BACKGROUND OF THE INVENTION

In recent years, semiconductor devices have been adapted to afford multiple functions. Thus, there is a case where a plurality of power supply systems are arranged in one semiconductor device, and for each of the power supply systems, one or a plurality of circuits are arranged.

In a semiconductor device where an analog circuit and a digital circuit are mixed, there is a case where respective powers are supplied independently to the digital circuit and the analog circuit (in other words, a power supply system is divided), in order to prevent noise in the digital circuit from being transferred to the analog circuit.

In a transmitting/receiving portion in which a transfer of an input/output signal is performed through a signal line between circuits driven by different power supply systems, respectively, it is necessary to prevent a breakdown when an ESD (Electro-Static Discharge) stress is applied.

FIG. 25 is a diagram showing a configuration of a conventional semiconductor device in which, a plurality of different power supply systems are provided and the transfer of an input/output signal is performed through a signal line between circuits driven by the power supply systems, respectively (refer to Patent Document 1).

Referring to FIG. 25, a first circuit connected to a first power supply system comprises an analog section including an analog circuit (21), an output circuit (23), and an input protection circuit (25), for example. A second circuit connected to a second power supply system comprises a digital section including a digital circuit (22) and an input circuit (24). Both of the analog and digital sections are connected through a signal line (S11). To the analog section, power is supplied from a high potential side power supply terminal (Vdd1) and a low potential side power supply terminal (Vss1). To the digital section, power is supplied from a high potential side power supply terminal (Vdd2) and a low potential side power supply terminal (Vss2). The low potential side power supply terminal (Vss1) and the low potential side power supply terminal (Vss2) are connected via a protection element (HK1).

When the low-potential side power supply terminal (Vss2) is grounded and the ESD stress is applied from the high potential side power supply terminal (Vdd1) in this device, for example, a potential on a signal line (S11) increases through a PMOS transistor constituting the output circuit (23) because the PMOS transistor is in an unstable state. Since a source of an NMOS transistor in the input circuit (24) is grounded, a potential difference Vgs is generated between the source of the NMOS transistor and a gate of the NMOS transistor.

Since the gate-to-source voltage Vgs is the potential difference that is generated by the ESD stress application, this voltage may exceed a breakdown voltage for a gate oxide film of the NMOS transistor in the input circuit (24). Accordingly, this voltage may cause breakdown of the gate oxide film of the NMOS transistor in the input circuit (24).

The above description was directed to an operation when the low potential side power supply terminal (Vss2) is grounded, and the ESD stress is applied from the high potential side power supply terminal (Vdd1). When the high potential side power supply terminal (Vdd2) is grounded, and the ESD stress is applied from the high potential side power supply terminal (Vdd1) as well, a similar operation may cause the breakdown of the gate oxide film of the PMOS transistor in the input circuit (24).

As a measure for reducing such a damage, there is a method of inserting a protection element such as an NMOS transistor (HK3), which prevents breakdowns of gate oxide films of NMOS and PMOS transistors that constitute an input circuit (54), as shown in FIG. 26 (refer to Patent Document 1).

The NMOS transistor (HK3) is in an OFF state during a normal operation, and does not affect transmission of a signal between an output circuit (53) and the input circuit (54).

When the low potential side power supply terminal (Vss2) is grounded and the ESD stress is applied from the high potential side power supply terminal (Vdd1) in this device, for example, a potential on the signal line (S11) increases through the PMOS transistor that constitutes the output circuit (53). When the potential exceeds a predetermined potential difference or more, the NMOS transistor (HK3) is turned on, and the signal line (S11) thereby has substantially the same potential as the low potential side power supply terminal (Vss2). Thus, the breakdown of the gate oxide film caused by an excessive increase in a gate potential of the NMOS transistor in the input circuit (54) can be prevented.

Patent Document 1

JP Patent Kokai Publication No. JP-A-9-172146 (FIGS. 23 and 24, and the like)

SUMMARY OF THE DISCLOSURE

In a configuration shown in FIG. 26, as a current that flows through the NMOS transistor (HK3), a current that exceeds discharging capability of the NMOS transistor (HK3) may flow into the NMOS transistor (HK3), depending on a circuit condition such as a gate width of the PMOS transistor in the output circuit (53), which may cause a damage to the NMOS transistor (HK3) itself. For this reason, in order to obtain a stable ESD withstand voltage, it is necessary to arrange the NMOS transistor (HK3) with a gate width that does not cause the breakdown against the current flown from the PMOS transistor in the output circuit into the NMOS transistor (HK3).

The current flown from the PMOS transistor of the output circuit (53) changes according to the size of the PMOS transistor. In leading-edge LSIs, finer dimension technologies, high-speed operation, and lower voltage operation have been achieved. A parasitic capacitance element of the NMOS transistor (HK3) affects response of the high-speed operation. For this reason, it is difficult to indiscriminately increase the size of the NMOS transistor (HK3) according to the size of the PMOS transistor in the output circuit (53).

The above described problem is solved by the invention schematically configured as follows.

A semiconductor integrated circuit device according to one aspect of the present invention, comprises: a plurality of power supply systems; a signal line connecting a circuit in one power supply system and a circuit in the other power supply system; and a circuit that restrains a current flowing from the circuit in said one power supply system into said signal line when an abnormal voltage is applied to said one power supply system.

The semiconductor integrated circuit according to the present invention, comprises a circuit that restrains the current flowing from one transistor in the one power supply system into other transistor in the other power system, the one transistor outputting a signal to the signal line, the other transistor receiving the signal through the signal line. The semiconductor integrated circuit device according to the present invention may include a circuit that restrains the current flowing into the other transistor in the other power supply system when the abnormal voltage is applied to the other power supply system, for the other transistor in the other power supply system.

A semiconductor integrated circuit device according to another aspect of the present invention includes:

an output circuit with power thereof supplied from one power supply system;

an input circuit with power thereof supplied from other power supply system different from the one power supply system, signal transfer being performed between the output circuit and the input circuit through a signal line; and a circuit that restrains a current flowing into the signal line when ESD (Electro-Static discharge) stress is applied.

The semiconductor integrated circuit device in the present invention includes:

a transistor with a current thereof being adjustably controlled according to a signal supplied to a control terminal thereof, said transistor being disposed at least one of between said output circuit and a high potential side power supply terminal in said one power supply system and between said output circuit and a low potential side power supply terminal in said one power supply system; and a control circuit that sets said transistor in an ON state at a time of a normal operation, and that changes a signal level at the control terminal of said transistor to limit the current that flows into said signal line, when the ESD stress is applied.

The semiconductor integrated circuit device in the present invention includes:

a transistor with a current thereof being adjustably controlled according to a signal supplied to a control terminal thereof, the transistor being disposed at least one of between the input circuit and a high potential side power supply terminal in the other power supply system and between the input circuit and a low potential side power supply terminal in the other power supply system; and a control circuit that sets the transistor in an ON state at a time of a normal operation and changes a signal level at the control terminal of the transistor when the ESD stress is applied.

In the present invention, at least two cascode connected transistors are arranged at least one of between the signal line and the high potential side power supply terminal and between the signal line and the low potential side power supply terminal.

In the present invention, the control circuit includes a series circuit comprising a capacitance element and a resistance, disposed between the high potential side power supply terminal and the low potential side power supply terminal, and a connecting point between the capacitance element and the resistance is connected to the control terminal of the transistor. Alternatively, in the present invention, the control circuit includes a series circuit constituted from a diode and a resistance, disposed between the high potential side power supply terminal and the low potential side power supply terminal, and a connecting point between the diode and the resistance is connected to the control terminal of the transistor.

In the present invention, one of diffusion layers of the transistor and a tap that gives a potential to a well with the diffusion layer formed therein may be arranged in contact with each other, the transistor being connected at least one of between the output circuit (or the input circuit) and the high potential side power supply terminal and between the output circuit (or the input circuit) and the low potential side power supply terminal, the tap being of a conductive type opposite to a conductive type of the diffusion layers of the transistor.

In the present invention, the output circuit may include:

a first transistor between the signal line and a high potential side power supply terminal in the one power supply system and a second transistor between the signal line and a low potential side power supply terminal in the one power supply system, an output of the output circuit being connected to the signal line; and a control circuit that generates a signal to be supplied to control terminals of the first and second transistors so that the first and second transistors are complementarily on/off controlled in response to an input signal received by the output circuit for being output to the signal line at a time of a normal operation, and adjustably controls a level at a control terminal of at least one of the first transistor and the second transistor at a time of the application of the ESD stress to the one power supply system, thereby limiting a current flowing from the output circuit to the signal line by the application of the ESD stress.

In the present invention, the control circuit may include:

a series circuit comprising a capacitance element and a resistance, disposed between the high potential side power supply terminal in the one power supply system and the low potential side power supply terminal in the one power supply system; and a logic circuit that generates a signal based on a potential at a connecting point between the capacitance element and the resistance and the input signal, the logic circuit generating the signal that set the first transistor in an ON state and sets the second transistor in an OFF state when the potential at the connecting point is of a level in which the application of the ESD stress is not detected and when the input signal is of a first value, and generating the signal that sets the first transistor in an OFF state and sets the second transistor in an ON state when the potential at the connecting point is of a level in which the application of the ESD stress is not detected and when the input signal is of a second value, the logic circuit outputting to the control terminals of the first and second transistors the signal that sets at least one of the first transistor and the second transistor in an OFF state when the potential at the connecting point of a level in which the application of the ESD stress is detected.

The meritorious effects of the present invention are summarized as follows.

According to the present invention, when the ESD stress is applied, the current that flows into the transistor which receives the input signal is restrained through the transistor that outputs the signal. The number of elements which protect a gate oxide film of the transistor that receives the input signal, against the electro-static discharge, can be thereby reduced, or such an element can be reduced in size.

Further, according to the present invention, a parasitic capacitance element of the protection element is reduced, and an improvement in responsiveness of a faster operation can be thereby expected.

Still other features and advantages of the present invention will become readily apparent to those skilled in this art from the following detailed description in conjunction with the accompanying drawings wherein embodiments of the invention are shown and described, simply by way of illustration of the mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 21A, 21B, 21C and 21D include diagrams showing layout configurations in the embodiment of the present invention;

DESCRIPTION OF THE INVENTION

A description of the invention will be given with reference to appended drawings.

First Embodiment

Figure 1:
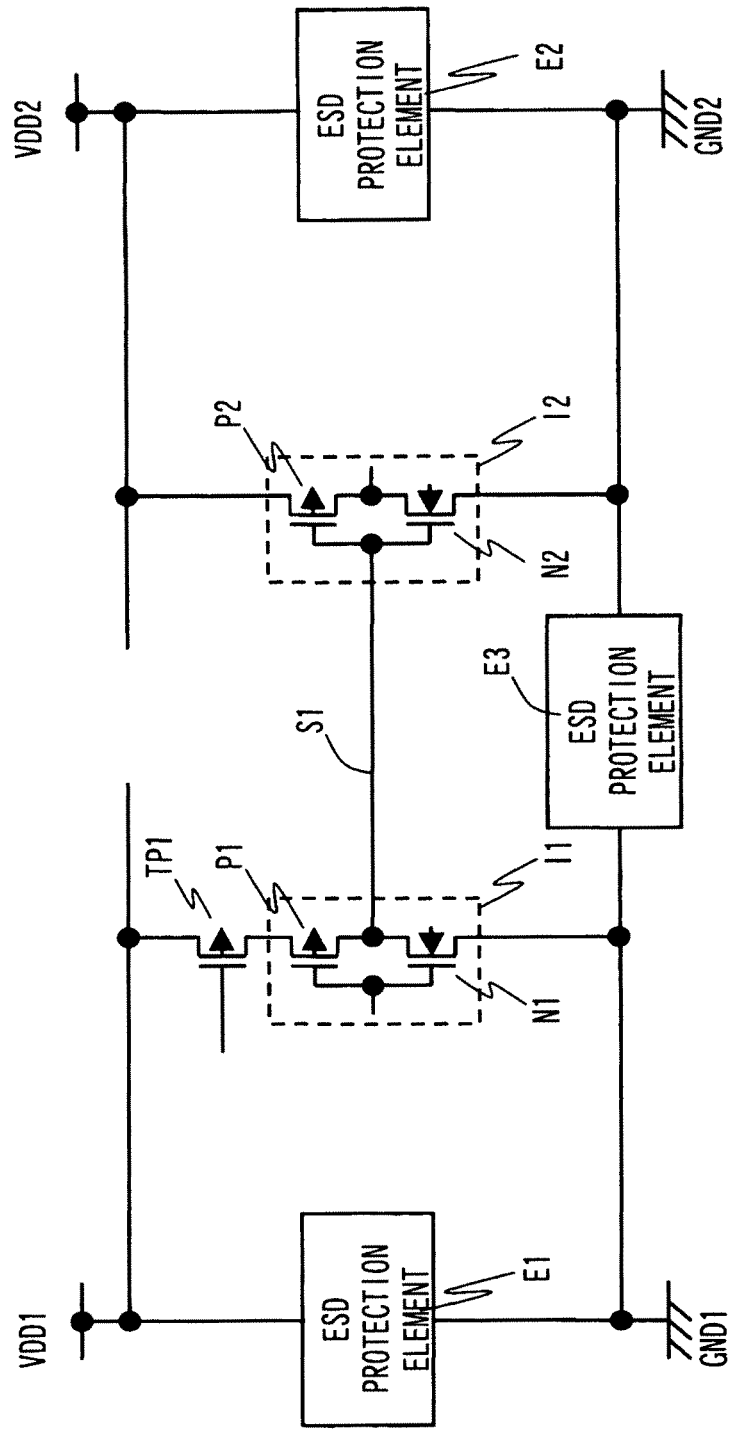
FIG. 1 is a diagram showing a configuration of a circuit according to a first embodiment of the present invention.

FIG. 1 is a diagram showing a circuit configuration according to a first embodiment of the present invention. Referring to FIG. 1, a first power supply system is provided from a power supply terminal VDD1 and a ground terminal GND1, while a second power supply system is provided from a power supply terminal VDD2 and a ground terminal GND2.

The first power supply system includes an ESD protection element E1, an output inverter circuit I1, and a PMOS transistor TP1 connected between the output inverter circuit I1 and the power supply terminal VDD1. The second power supply system includes an ESD protection element E2 and an input inverter circuit I2. An output of the output inverter circuit I1 in the first power supply system and an input of the input inverter circuit I2 in the second power supply system are connected through a signal line S1 that transfers a signal. Between the ground terminal GND1 in the first power supply system and the ground terminal GND2 in the second power supply system, an ESD protection element E3 is connected.

Next, an operation in the first embodiment of the present invention will be described. The output inverter circuit I1 in the first power supply system is composed by an NMOS transistor N1 and a PMOS transistor P1, and the PMOS transistor TP1 is connected between the PMOS transistor P1 and the power supply terminal VDD1.

Referring to FIG. 1, when ESD is applied to the power supply terminal VDD1 with the ground terminal GND2 as a reference point, for example, a current flown into the PMOS transistor P1 of the output inverter circuit I1 can be restrained by arranging and controlling the PMOS transistor TP1. As a result, a current that flows into the signal line S1 through the PMOS transistor P1 can be restrained, thereby allowing limitation of a potential difference Vgs between a gate of an NMOS transistor N2 of the input inverter circuit I2 and a source of the NMOS transistor N2 within a voltage that might cause breakdown of a gate oxide film of the NMOS transistor N2. With this arrangement, breakdown of the gate of the NMOS transistor N2 can be prevented, and a stable ESD withstand voltage can be thereby obtained.

Electric charge applied to the power supply terminal VDD1 by the ESD stress application is discharged to the ground terminal GND2 through the ESD protection elements E1 and E3.

Figure 2:
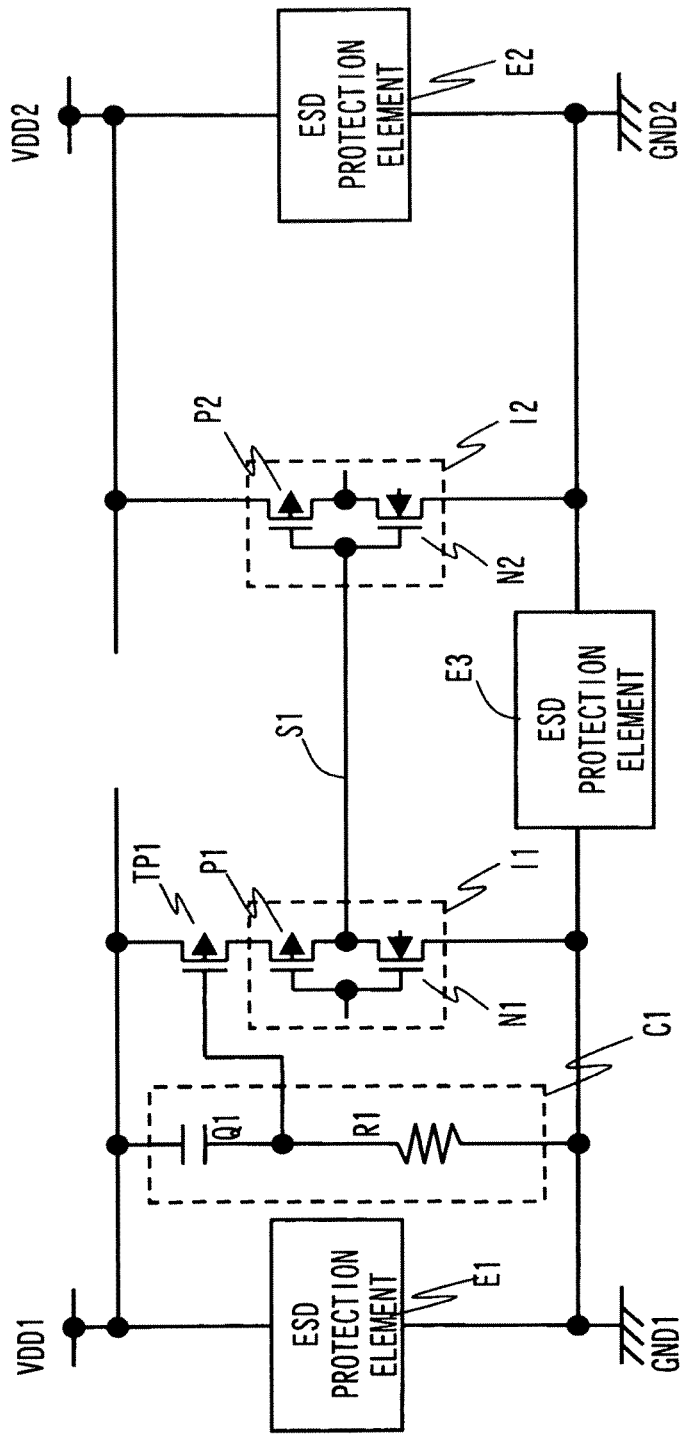
FIG. 2 is a diagram showing an example of a configuration of a control circuit in the first embodiment of the present invention.

FIG. 2 is a diagram showing a configuration of a circuit in which a circuit C1 that controls a gate of the PMOS transistor TP1 is provided in the first embodiment of the present invention described with reference to FIG. 1. The configuration except for the control circuit C1 that controls the gate of the PMOS transistor TP1 is the same as in FIG. 1. Below, a description of components that are the same as those in FIG. 1 will be omitted as necessary, and the description will be mainly directed to a difference.

Referring to FIG. 2, in the control circuit C1, a resistance element R1 is connected between the gate of the PMOS transistor TP1 and the ground terminal GND1, a capacitance element (capacitor) Q1 is connected between the gate of the PMOS transistor TP1 and the power supply terminal VDD1, and the resistance element R1 and the capacitance element Q1 are connected.

Since the gate of the PMOS transistor TP1 is connected to the ground terminal GND1 through the resistance element R1 of the control circuit C1, the PMOS transistor TP1 is set an ON state (conductive state) when a normal operation is performed, and does not affect an operation of the circuit.

When the ESD stress is applied to the power supply terminal VDD1, with the ground terminal GND2 as a reference point, electric charge is applied to the capacitance element Q1 between the power supply terminal VDD1 and the gate of the PMOS transistor TP1.

By coupling of the electric charge applied to the capacitance element Q1, a gate potential of the PMOS transistor TP1 increases to become the same potential as a source potential of the PMOS transistor TP1. The PMOS transistor TP1 thereby becomes the OFF state, and a current that flows into the PMOS transistor P1 can be thereby restrained. As a result, a current that flows into the signal line S1 through the PMOS transistor P1 can be limited. The breakdown of the gate oxide film of the NMOS transistor N2 can be thereby prevented, as described with reference to FIG. 1.

Figure 3:
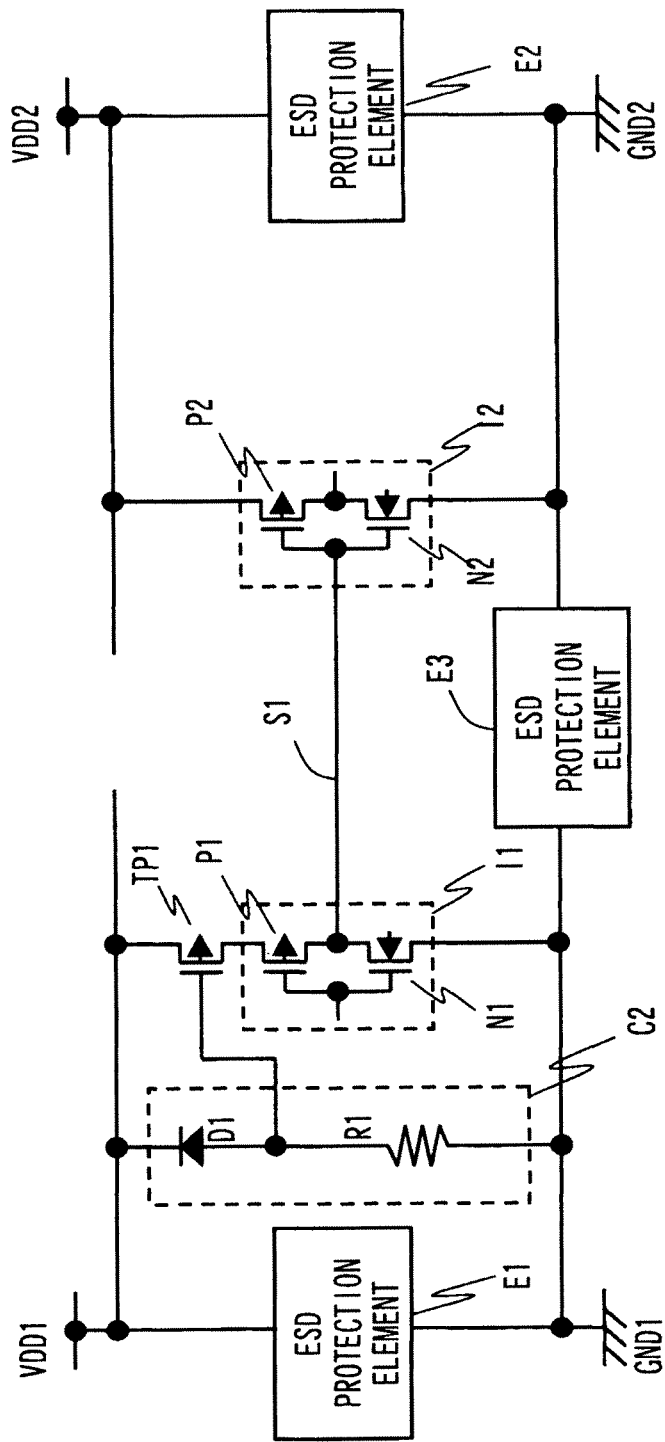
FIG. 3 is a diagram showing another example of the configuration of the control circuit in the first embodiment of the present invention.

FIG. 3 is a diagram showing a configuration of a circuit in which a control circuit C2 of other configuration that controls the gate of the PMOS transistor TP1 is provided in a semiconductor device in the first embodiment of the present invention described with reference to FIG. 1. The configuration except for the control circuit C2 is the same as in FIG. 1. Below, descriptions of components that are the same as those in FIG. 1 will be omitted as necessary, and a description will be mainly directed a difference.

Referring to FIG. 3, in the control circuit C2, a resistance element R1 is connected between the gate of the PMOS transistor TP1 and the ground terminal GND1, a diode element D1 is connected between the gate of the PMOS transistor TP1 and the power supply terminal VDD1, and the resistance element R1 and the diode element D1 are connected.

In the present embodiment, the PMOS transistor TP1 becomes the ON state (conductive state) when a normal operation is performed, and does not affect an operation of the circuit, as in an example shown in FIG. 2.

Referring to FIG. 3, when the ESD stress is applied to the power supply terminal VDD1 with the ground terminal GND1 as a reference point, the diode element D1 is turned on due to avalanche breakdown of the diode element D1. Then, as in FIG. 2, the PMOS transistor TP1 becomes the OFF state, and a current that flows into the PMOS transistor P1 can be restrained. As a result, a current that flows into the signal line S1 through the PMOS transistor P1 can be limited. The breakdown of the gate oxide film of the NMOS transistor N2 can be thereby prevented, as described with reference to FIG. 1.

In the present embodiment, an example is shown where the ESD protection element E3 is used for the connection between the ground terminal GND1 of the first power supply system and the ground terminal GND2 of the second power system. A resistance element may be used for the connection, or the connection may be short-circuited.

Figure 4:
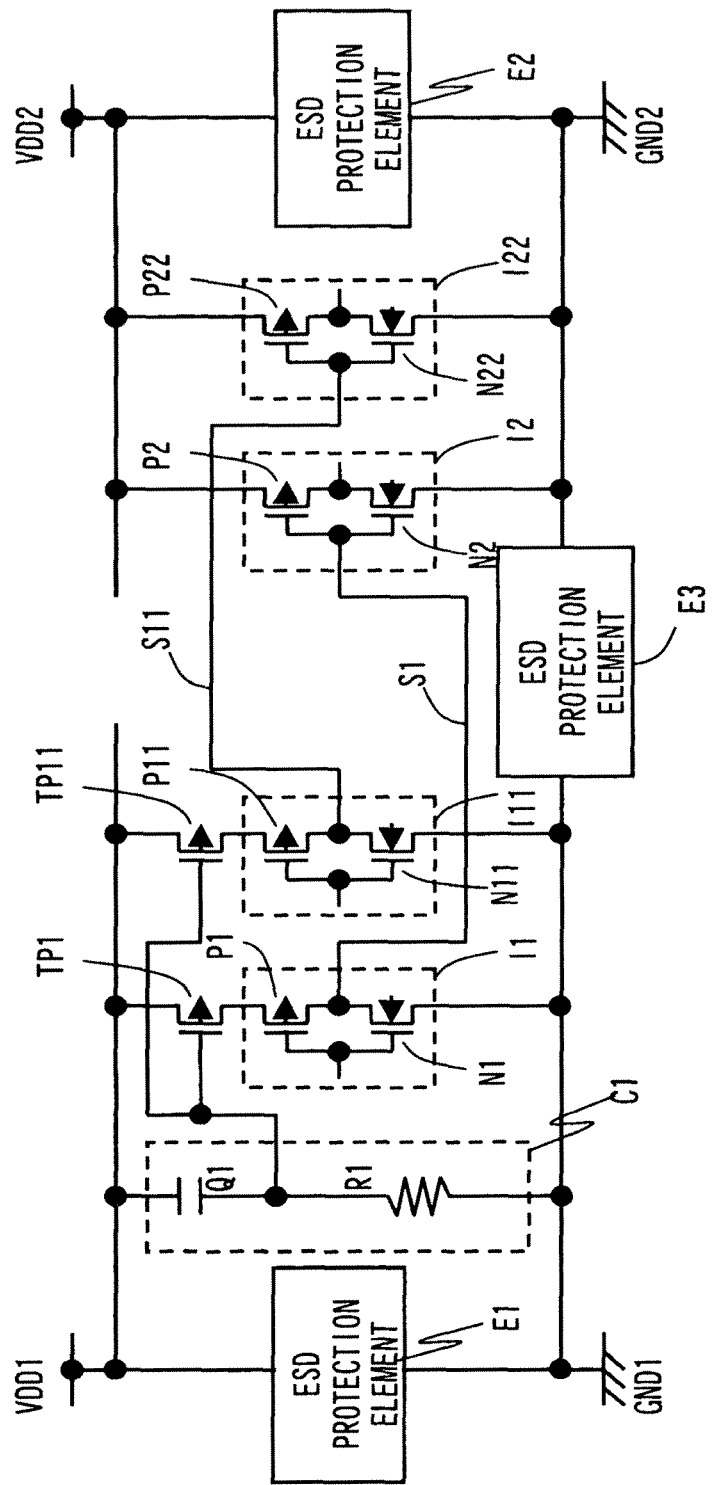
FIG. 4 is a diagram showing an example of other configuration in the first embodiment of the present invention.

In the present embodiment, the control circuit C1 in FIG. 2 and the control circuit C2 in FIG. 3 are not limited to configurations that control one PMOS transistor TP1. The control circuit C1 (or C2) may control a plurality of output circuits, as shown in FIG. 4, for example. In an example shown in FIG. 4, an output of the control circuit C1 (at a connecting point between the capacitance element Q1 and the resistance element R1) is connected to the output inverter circuit I1 and an output inverter circuit I11, and is connected in common to the gate of the PMOS transistor TP1 and a gate of a PMOS transistor TP11 connected between the power supplies.

The diode element D1 of the control circuit C2 in FIG. 3 may be of course an arbitrary element that has a PN junction such as an NMOS transistor, a PMOS transistor, or a bipolar transistor.

Figure 20A:
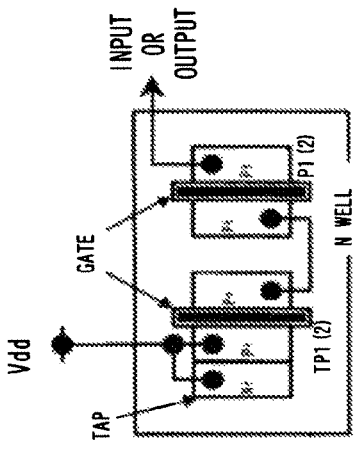
FIGS. 20A, 20B, 20C and 20D include diagrams showing layout configurations in the embodiment of the present invention.
Figure 20C:
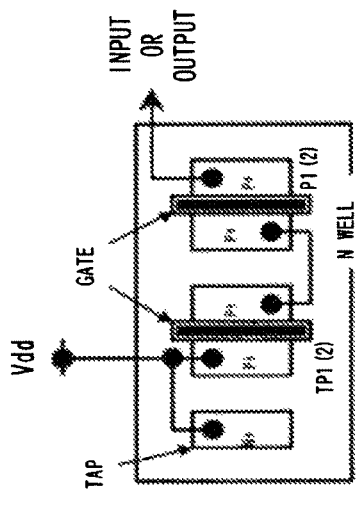
Figure 20B:
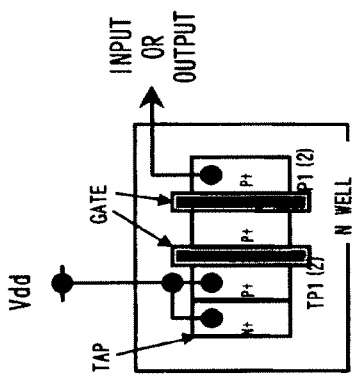
Figure 20D:
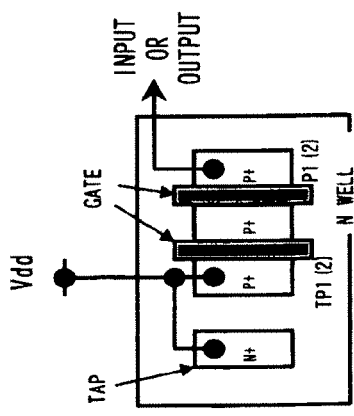

Next, the present embodiment will be described with reference to layout diagrams in FIGS. 20A-20D. The PMOS transistors P1 and TP1 are formed according to each layout plan view in FIGS. 20A-20D, for example. In FIG. 20A, a source diffusion layer of the PMOS transistor P1 of the output inverter circuit I1 (or a PMOS transistor P2 of the input inverter circuit I2) is separated from a drain diffusion layer of the PMOS transistor TP1 (a PMOS transistor TP2), and the source diffusion layer and the drain diffusion layer are connected via contacts and a first metal interconnect layer or the like. In FIG. 20B, the source diffusion layer of the PMOS transistor P1 of the output inverter circuit I1 (or the PMOS transistor P2 of the input inverter circuit I2) and the drain diffusion layer of the PMOS transistor TP1 (TP2) are common.

As shown in FIGS. 20A and 20B, an N-type diffusion layer (Tap) that assumes an N well potential is often arranged separated from a P-type diffusion layer where the PMOS transistors P1 and TP1 are formed. As described before, since the gate of the PMOS transistor TP1 is controlled to turn the PMOS transistor TP1 off when the ESD stress is applied. On this occasion, the PMOS transistor TP1 may operate simultaneously with the ESD protection element (indicated by reference numeral E1 in FIG. 1).

Then, in order to prevent the operation of the PMOS transistor TP1 simultaneously with the ESD protection element (indicated by the reference numeral E1 in FIG. 1), it is effective to bring a P-type diffusion layer of the PMOS transistor TP1 into contact with the N-type diffusion layer (Tap) that assumes the N-well potential.

When the ESD stress is applied, an ESD surge flows into the drain diffusion layer through an N well resistance due to the avalanche breakdown at the PN junction between an N well and the drain diffusion layer of the PMOS transistor.

Due to a voltage drop caused by the N well resistance, a parasitic bipolar transistor of the PMOS transistor operates, and an ESD surge current flows between a source of the parasitic bipolar transistor and a drain of the parasitic bipolar transistor. However, by bringing the P-type diffusion layer of the PMOS transistor TP1 into contact with the N-type diffusion layer (Tap) that assumes the N well potential, the N well resistance decreases, and the voltage drop is thereby reduced. Accordingly, the parasitic bipolar transistor of the PMOS transistor TP1 will not operate. As a result, the PMOS transistor keeps the OFF state, making it easy to limit the current that flows into the PMOS transistor P1.

Figure 26:
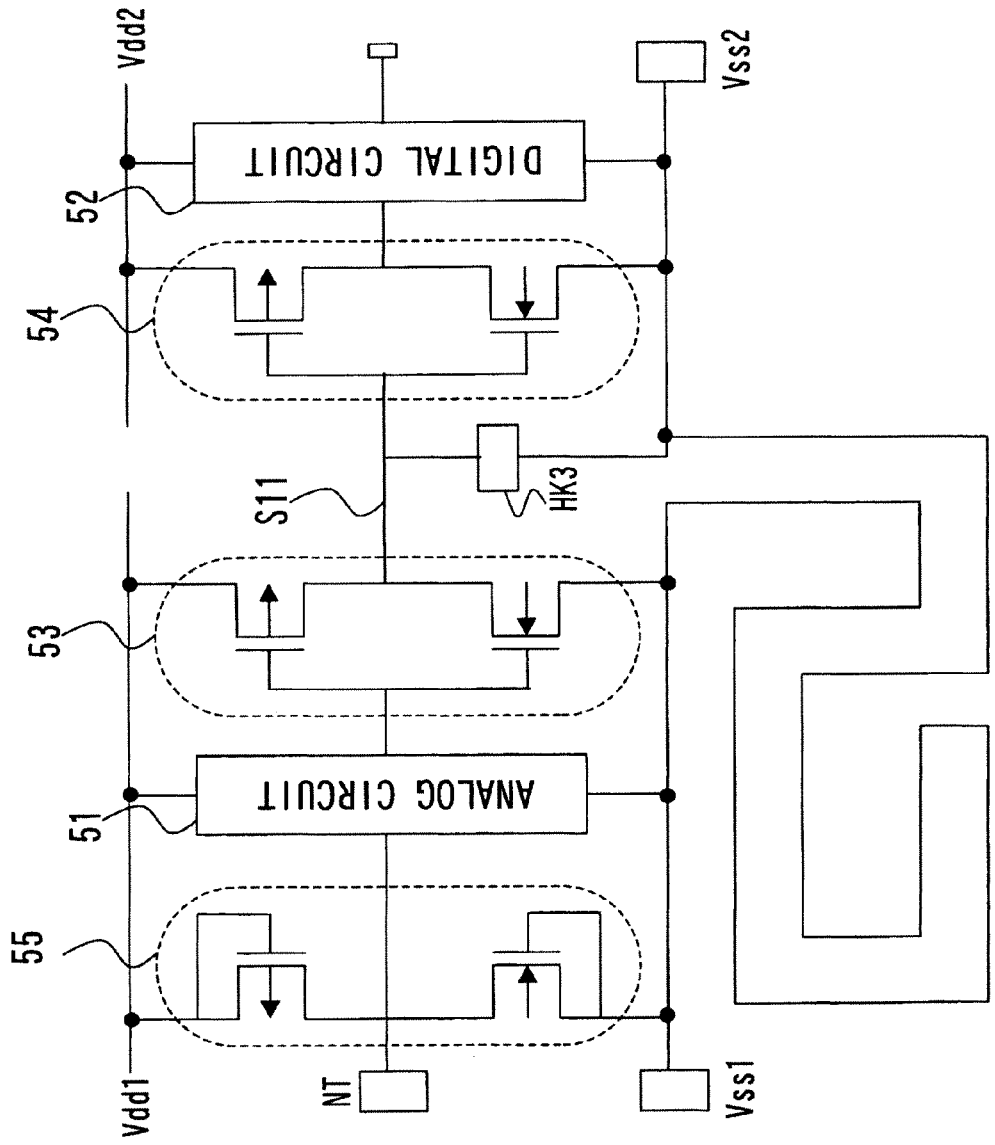
FIG. 26 is a diagram showing a configuration disclosed in Patent Document 1.

As described above, the PMOS transistor TP1 is provided between the PMOS transistor P1 in the output inverter circuit I1 and the power supply terminal VDD1, and the gate of the PMOS transistor TP1 is controlled, in the first embodiment of the present invention. The current that flows into the PMOS transistor P1 can be thereby limited, and the current that flows into the signal line S1 from the PMOS transistor P1 can be restrained. For this reason, the potential difference Vgs between the gate of the NMOS transistor N2 and the source of the NMOS transistor N2 in the input inverter circuit I2 can be limited within a voltage that might cause the breakdown of the gate oxide film of the NMOS transistor N2. For this reason, according to the first embodiment, the number of protection elements (HK3) that prevent the breakdown of the gate oxide film, shown in FIG. 26 can be reduced, or such a protection element (HK3) can be reduced in size.

Second Embodiment

Figure 5:
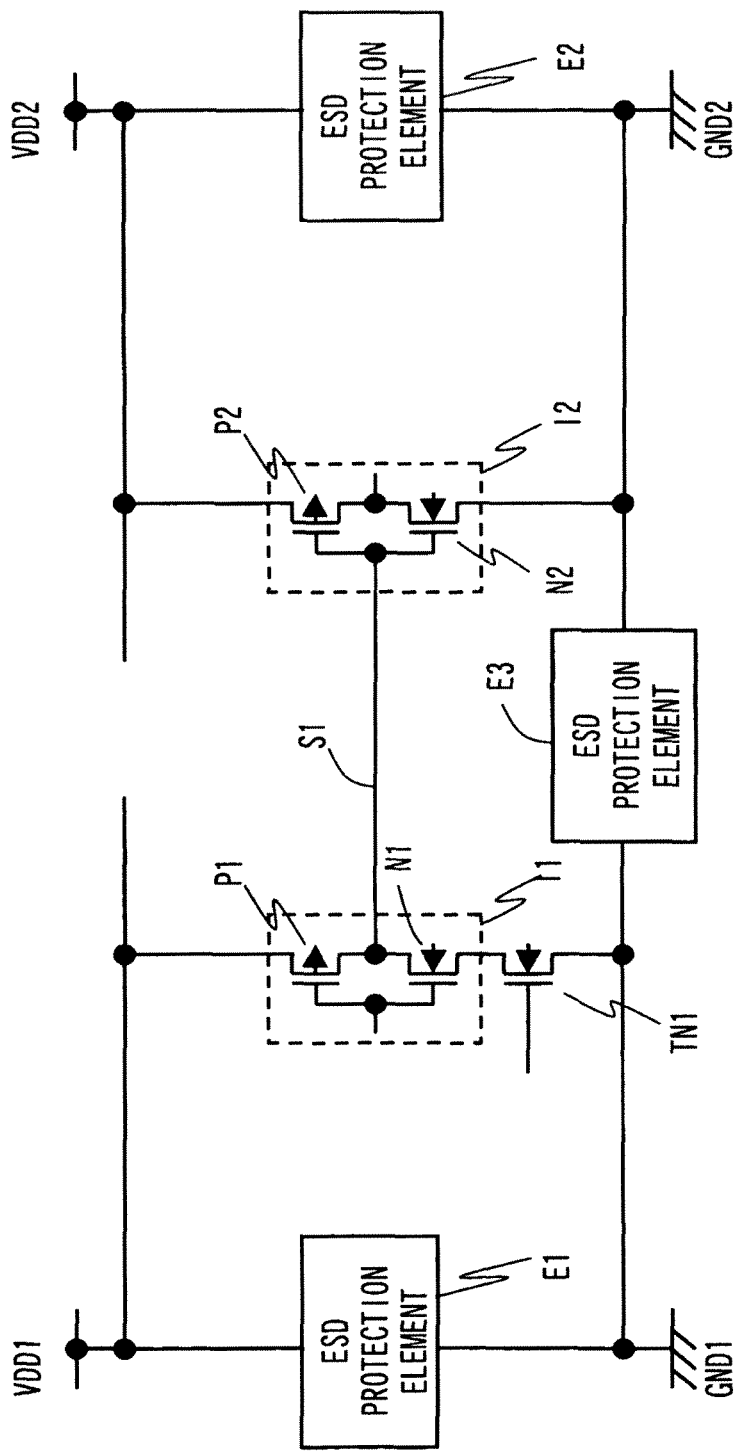
FIG. 5 is a diagram showing a configuration of a circuit according to a second embodiment of the present invention.

FIG. 5 is a diagram showing a configuration of a circuit according to a second embodiment of the present invention. Referring to FIG. 5, same reference numerals are assigned to components that are the same as those in FIG. 1. Below, descriptions of the same components will be omitted as necessary, and a description will be directed to a difference.

Referring to FIG. 5, the second embodiment of the present invention includes an NMOS transistor TN1 connected between the output inverter circuit I1 and the ground terminal GND1, in place of the PMOS transistor TP1 in FIG. 1.

The output inverter circuit I1 in the first power supply system is composed by the NMOS transistor N1 and the PMOS transistor P1, and the NMOS transistor TN1 is connected between the NMOS transistor N1 and the ground terminal GND1.

Referring to FIG. 5, when the ESD stress is applied to the ground terminal GND1 with the power supply terminal VDD2 as a reference point, for example, a current flown into the NMOS transistor N1 can be restrained by arranging and controlling the NMOS transistor TN1. As a result, a current that flows into the signal line S1 through the NMOS transistor N1 can be restrained, thereby allowing limitation of a potential difference Vgs between a gate of the PMOS transistor P2 and a source of the PMOS transistor P2 within a voltage that causes breakdown of a gate oxide film of the PMOS transistor P2. Breakdown of the gate of the PMOS transistor P2 is thereby prevented, and a stable ESD withstand voltage can be thereby obtained. An electric charge injected into the ground terminal GND1 by the ESD stress application is discharged to the power supply terminal VDD2 through the ESD protection elements E3 and E2.

Figure 6:
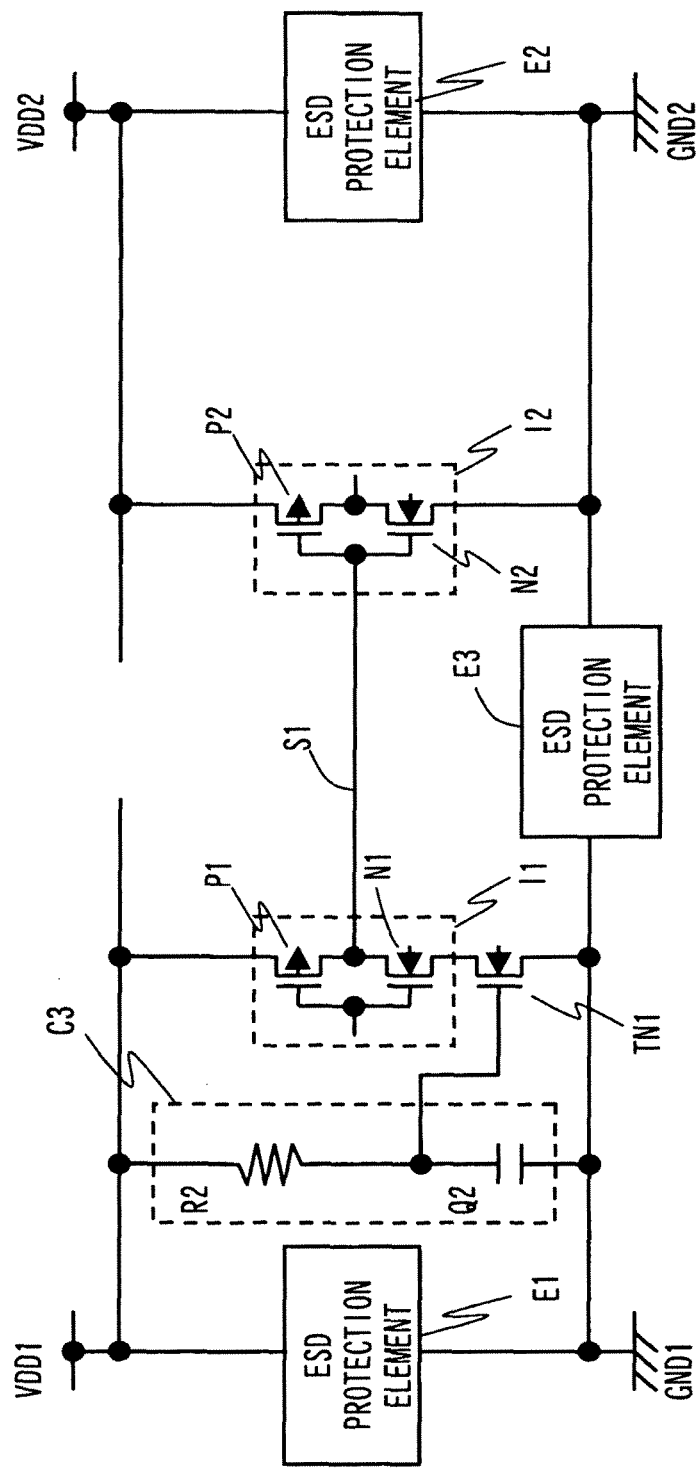
FIG. 6 is a diagram showing an example of a configuration of a control circuit in the second embodiment of the present invention.

FIG. 6 is a diagram showing a configuration of a circuit in which a circuit C3 that controls a gate of the NMOS transistor TN1 is provided in a semiconductor device in the second embodiment of the present invention. Referring to FIG. 6, same reference numerals are assigned to components that are the same as those in FIG. 5. Below, descriptions of the same components will be omitted as necessary, and a description will be mainly directed to a difference.

Referring to FIG. 6, the circuit C3 that controls a gate potential of the NMOS transistor TN1 connected between the output inverter circuit I1 and the ground terminal GND1 is included.

In the control circuit C3, a resistance element R2 is connected between the gate of the NMOS transistor TN1 and the power supply terminal VDD1, a capacitance element Q2 is connected between the gate of the TMOS transistor TN1 and the ground terminal GND1, and the resistance element R2 and the capacitance element Q2 are connected. The gate of the NMOS transistor TN1 is connected to the power supply VDD1 through the resistance element R2 of the control circuit C3. For this reason, the NMOS transistor TN1 becomes the ON state (conductive state) when a normal operation is performed, and does not affect an operation of the circuit.

Referring to FIG. 6, when the ESD stress is applied to the ground terminal GND1 with the power supply terminal VDD2 as a reference point, electric charge is charged into the capacitance element Q2 between the ground terminal GND1 and the gate of the NMOS transistor TN1. By coupling of the electric charge applied to the capacitance element Q2, the gate potential of the NMOS transistor TN1 increases to become the same potential as a source potential of the NMOS transistor TN1. The NMOS transistor TN1 thereby becomes the OFF state, and a current that flows into the NMOS transistor N1 can be thereby restrained. As a result, a current that flows into the signal line S1 through the NMOS transistor N1 can be limited. The breakdown of the gate oxide film of the PMOS transistor P2 can be thereby prevented, as described with reference to FIG. 5.

Figure 7:
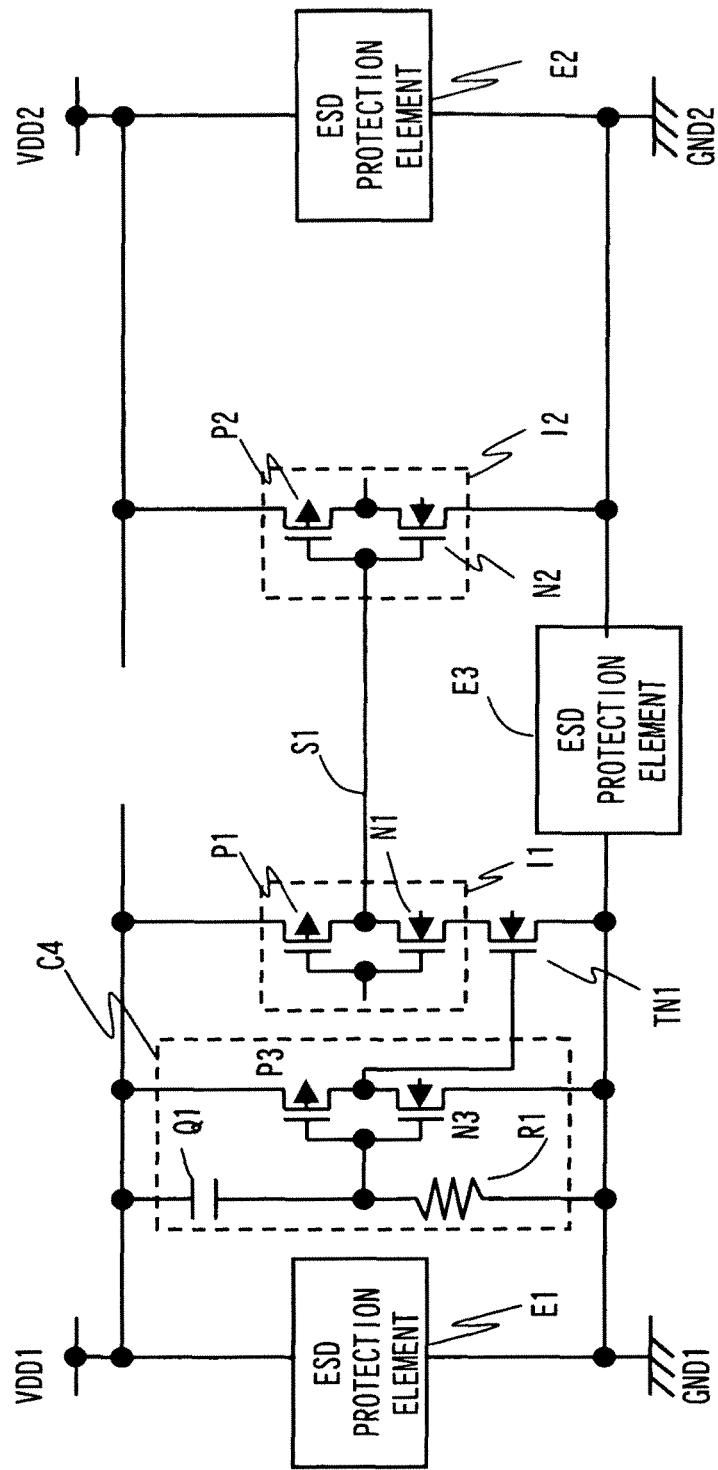
FIG. 7 is a diagram showing other configuration of the control circuit in the second embodiment of the present invention.

FIG. 7 is a diagram showing a configuration of a circuit in which a control circuit C4 that controls the gate of the NMOS transistor TN1 is provided in the second embodiment of the present invention.

Referring to FIG. 7, the control circuit C4 includes an inverter circuit constituted from an NMOS transistor N3 and a PMOS transistor P3, and the gate of the NMOS transistor TN1 is connected to an output node (coupled drains of the NMOS transistor N3 and the PMOS transistor P3) of the inverter circuit. The resistance element R1 is connected between an input node of this inverter circuit (coupled gates of the NMOS transistor N3 and the PMOS transistor P3) and the ground terminal GND1, and the capacitance element Q1 is connected between the input node and the power supply terminal VDD1. As in FIG. 6, the NMOS transistor TN1 becomes the ON state (conductive state) when a normal operation is performed, and does not affect an operation of the circuit.

Referring to FIG. 7, when the ESD stress is applied to the power supply terminal VDD1 with the ground terminal GND2 as a reference point, electric charge is charged into the capacitance element Q1 through the ESD protection element E1. Then, due to an operation similar to that in FIG. 2, the PMOS transistor P3 becomes the OFF state, and the NMOS transistor TN1 becomes the OFF state due to an output signal of the inverter circuit constituted from the PMOS transistor P3 and the NMOS transistor N3.

Accordingly, a current that flows into the NMOS transistor N1 can be restricted. As a result, a current that flows into the signal line S1 through the NMOS transistor N1 can be limited. The breakdown of the gate oxide film of the PMOS transistor P2 can be prevented, as described with reference to FIG. 5.

Figure 21A:
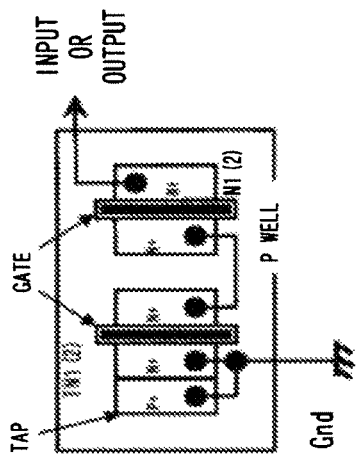
Figure 21B:
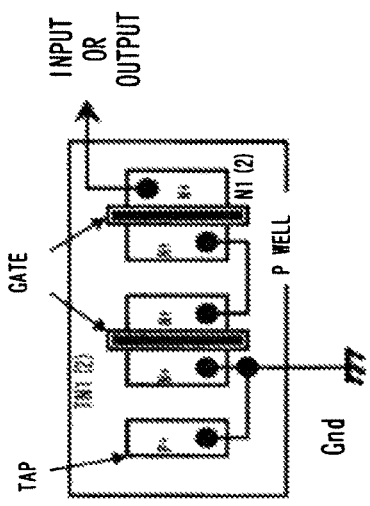
Figure 21B:
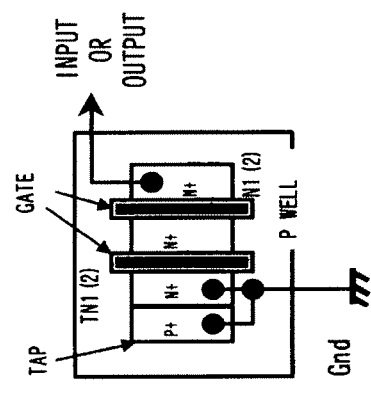
Figure 21D:
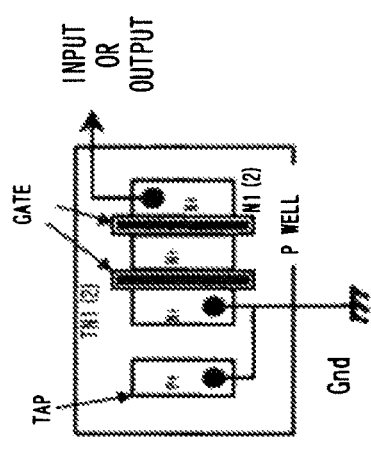

Next, the embodiment of the present invention will be described with reference to FIGS. 21A-21D. The NMOS transistors N1 and TN1 are formed according to each layout plan view in FIGS. 21A-21D, for example. In FIG. 21A, a source diffusion layer of the NMOS transistor N1 of the output inverter circuit I1 (or the NMOS transistor N2 of the input inverter circuit I2) is separated from a drain diffusion layer of the NMOS transistor TN1 (an NMOS transistor TN2), and the source diffusion layer and the drain diffusion layer are mutually connected via contacts and a first interconnect layer or the like. In FIG. 21B, the source diffusion layer of the NMOS transistor N1 of the output inverter circuit I1 (or the NMOS transistor N2 of the input inverter circuit I2) and the drain diffusion layer of the NMOS transistor TN1 (TN2) are common.

As shown in FIGS. 21A and 21B, a P-type diffusion layer (Tap) that assumes a P well potential is often arranged separated from an N-type diffusion layer where the NMOS transistors N1 and TN1 are formed. As described before, since the gate of the NMOS transistor TN1 is controlled to turn the NMOS transistor TN1 off when the ESD stress is applied. On this occasion, the NMOS transistor TN1 may operate simultaneously with the ESD protection element (indicated by reference numeral E1 in FIG. 5).

Then, in order to prevent the NMOS transistor TN1 from operating simultaneously with the ESD protection element (indicated by reference numeral E1 in FIG. 5), it is effective to bring the N-type diffusion layer of the NMOS transistor TN1 into contact with the P-type diffusion layer (Tap) that assumes the P-well potential.

When the ESD stress is applied, an ESD surge flows into the drain diffusion layer through a P well resistance due to the avalanche breakdown at the PN junction between a P well and the drain diffusion layer of the NMOS transistor.

Due to a voltage drop caused by the P well resistance, a parasitic bipolar transistor of the NMOS transistor operates, and an ESD surge current flows between a source of the parasitic bipolar transistor and a drain of the parasitic bipolar transistor. However, by bringing the N-type diffusion layer of the NMOS transistor TN1 into contact with the P-type diffusion layer (Tap) that assumes the P well potential, the P well resistance decreases, and the voltage drop is thereby reduced. Accordingly, the parasitic bipolar transistor of the NMOS transistor will not operate. As a result, the NMOS transistor TN1 keeps the OFF state, making it easy to limit the current that flows into the NMOS transistor N1.

As described above, in the second embodiment of the present invention, the NMOS transistor TN1 is provided between the NMOS transistor N1 in the output inverter circuit I1 and the ground terminal GND1, and the gate of the NMOS transistor TN1 is controlled. The current that flows into the NMOS transistor N1 can be thereby limited, and the current that flows into the signal line S1 from the NMOS transistor N1 can be restrained. For this reason, a potential difference Vgs between the gate of the PMOS transistor P2 and the source of the PMOS transistor P2 in the input inverter circuit I2 can be limited within the voltage that might cause the breakdown of the gate oxide film of the PMOS transistor P2. As a result, the number of the protection elements can be reduced, or the protection element can be reduced in size.

In the second embodiment of the present invention, the transistor that limits an ESD current is provided between the output inverter circuit and the ground terminal GND1. Thus, when the ESD stress is applied to the ground terminal GND1 with the power supply terminal VDD2 as the reference point, the potential difference Vgs on the gate oxide film of the PMOS transistor P2 of the input inverter circuit I2 can be reduced to a voltage that might cause the breakdown of the gate oxide film, or less. Thus, the breakdown of the gate of the PMOS transistor P2 can be prevented.

Third Embodiment

Figure 8:
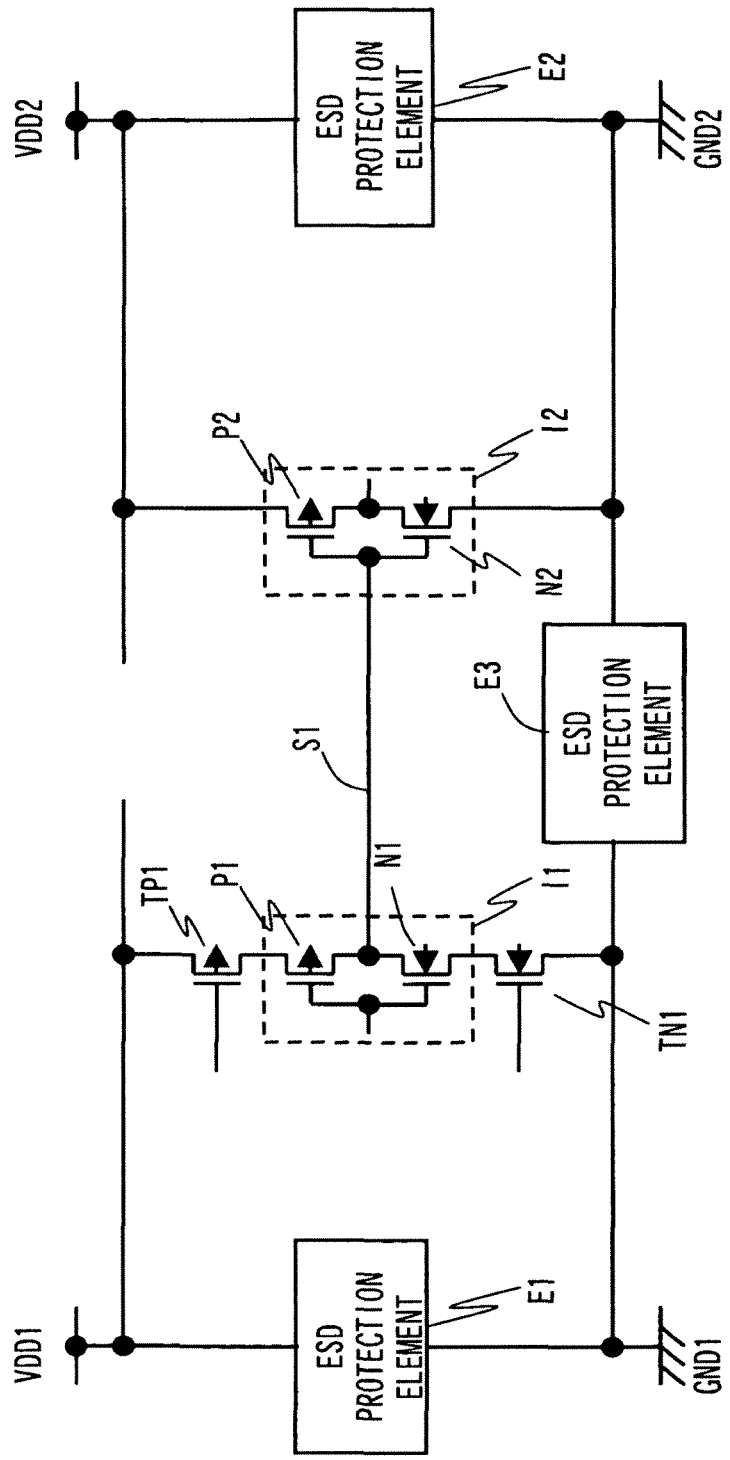
FIG. 8 is a diagram showing a configuration of a circuit according to a third embodiment of the present invention.

FIG. 8 is a diagram showing a configuration of a circuit according to a third embodiment of the present invention. This embodiment is configured to combine the first embodiment shown in FIG. 1 with the second embodiment shown in FIG. 5. Referring to FIG. 8, same reference numerals are assigned to components that are the same as those in FIGS. 1 and 5, and descriptions of the same components will be omitted. This embodiment includes the PMOS transistor TP1 between the output inverter circuit I1 and the power supply terminal VDD1 and the NMOS transistor TN1 between the output inverter circuit I1 and the ground GND1.

Referring to FIG. 8, the output inverter circuit I1 in the first power supply system is composed by the NMOS transistor N1 and the PMOS transistor P1. Between the PMOS transistor P1 and the power supply terminal VDD1, the PMOS transistor TP1 is connected. Between the NMOS transistor N1 and the ground terminal GND1, the NMOS transistor TN1 is connected.

Referring to FIG. 8, when the ESD stress is applied to the power supply terminal VDD1 with the ground terminal GND2 as a reference point, for example, the same effect as that in FIG. 1 is obtained. When the ESD stress is applied, to the ground terminal GND1 with the power supply terminal VDD2 as a reference point as well, the same effect as that in FIG. 5 is obtained.

Figure 9:
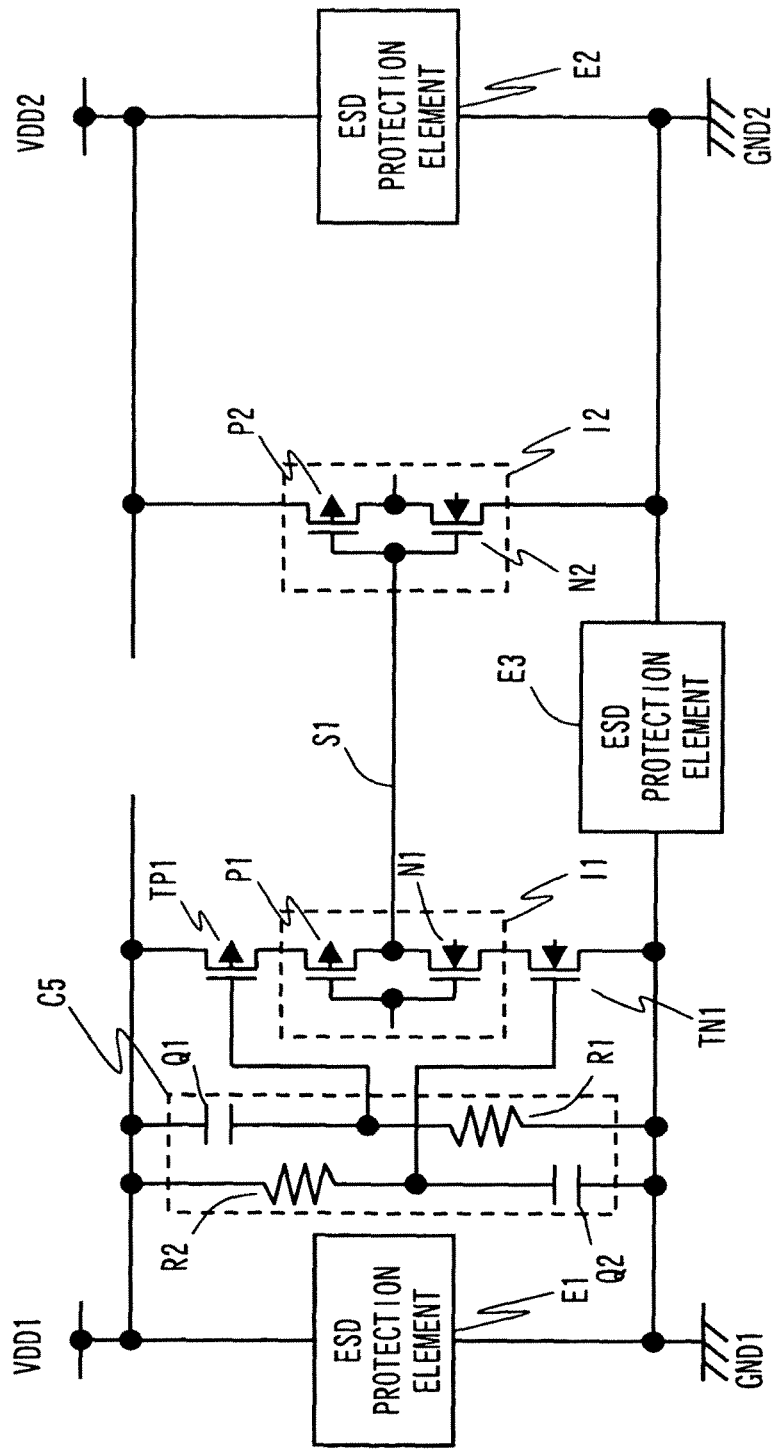
FIG. 9 is a diagram showing an example of a configuration of a control circuit in the third embodiment of the present invention.

FIG. 9 is a diagram showing a configuration of a circuit in which a circuit C5 that controls the gates of the PMOS transistor TP1 and the NMOS transistor TN1, respectively, is provided. Referring to FIG. 9, the control circuit C5 includes the control circuit C1 in FIG. 2, (which controls the gate of the PMOS transistor TP1), and the control circuit C3 in FIG. 6, (which controls the gate of the NMOS transistor TN1).

Referring to FIG. 9, the PMOS transistor TP1 is connected between the PMOS transistor P1 of the output inverter circuit I1 and the power supply terminal VDD1, and the NMOS transistor TN1 is connected between the NMOS transistor N1 of the output inverter circuit I1 and the ground terminal GND1. To the gates of the NMOS transistor TN1 and the PMOS transistor TP1, the circuit C5 that controls potentials of the gates of the NMOS transistor TN1 and the PMOS transistor TP1 is connected.

The control circuit C5 comprises a capacitance element Q1 connected between the gate of the PMOS transistor TP1 and the power supply terminal VDD1, a resistance element R1 connected between the capacitance element Q1 and the ground terminal GND1, a resistance element R2 connected between the gate of the NMOS transistor TN1 and the power supply terminal VDD1, and a capacitance element Q2 connected between the ground terminal GND1 and the resistance element R2. As in FIGS. 2 and 6, in the present embodiment as well, the PMOS transistor TP1 becomes the ON state (conduction stage) at a time of a normal operation, and does not affect an operation of the circuit.

Referring to FIG. 9, when the ESD stress is applied to the power supply terminal VDD1 with the ground terminal GND2 as a reference point, for example, the same effect as that in FIG. 2 is obtained. When the ESD stress is applied to the ground terminal GND1 with the power supply terminal VDD2 as a reference point as well, the same effect as that in FIG. 6 is obtained.

Figure 10:
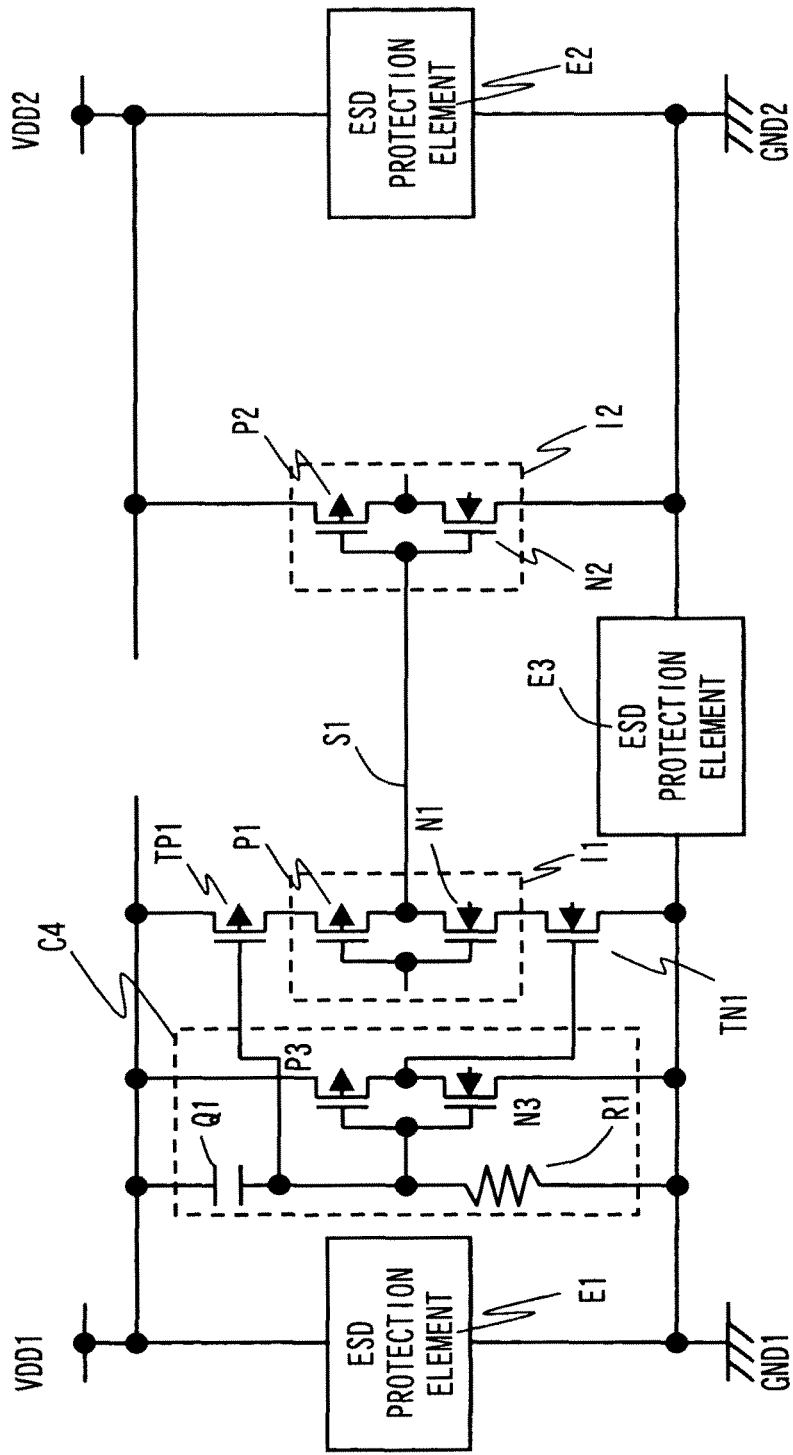
FIG. 10 is a diagram showing other configuration of the control circuit in the third embodiment of the present invention.

FIG. 10 is a diagram showing a configuration of a circuit in which a circuit C4 that controls the gates of the PMOS transistor TP1 and the NMOS transistor TN1, respectively, is provided in the third embodiment of the present invention. A configuration of the control circuit C4 is the same as in FIG. 7.

Referring to FIG. 10, the third embodiment of the present invention is a configuration that combines FIG. 2 with the FIG. 7. As in FIGS. 2 and 7, the NMOS transistor TN1 and the PMOS transistor TP1 become the ON states (conductive states), respectively, at a time of a normal operation, and do not affect an operation of the circuit.

Referring to FIG. 10, when the ESD stress is applied to the power supply terminal VDD1 with the ground terminal GND2 as a reference point, for example, or the ESD stress is applied to the ground terminal GND1 with the power supply terminal VDD2 as a reference point, the same effect as that in FIG. 9 is obtained.

As described above, in the third embodiment of the present invention, the potential difference Vgs applied between the gate of the PMOS transistor P2 and the source of the PMOS transistor P2 in the input inverter circuit I2 or the potential difference Vgs applied between the gate of the NMOS transistor N2 and the source of the NMOS transistor N2 can be limited within the voltage that might cause the breakdown of the gate oxide film of the PMOS transistor P2 or the NMOS transistor N2. The breakdown of the gate of the PMOS transistor P2 of the input inverter circuit I2 or the breakdown of the gate oxide film of the NMOS transistor N2 of the input inverter circuit I2 can be prevented. As a result, the number of the protection elements can be reduced, or the protection element can be reduced in size.

In the first embodiment, a protection circuit when the ESD stress is applied between the terminal VDD1 and the terminal GND2 is shown. In the second embodiment, a protection circuit when the ESD stress is applied between the terminal GND1 and the terminal VDD2 is shown. According to this third embodiment, even if the ESD stress is applied both between the terminal VDD1 and the terminal GND2 and between the terminal VDD2 and the terminal GND1, the breakdown of the gates of the PMOS transistor P2 and the NMOS transistor N2 that constitute the input inverter circuit I2 can be prevented. Thus, the third embodiment provides more excellent protection capability as compared with the first and second embodiments.

Fourth Embodiment

Figure 11:
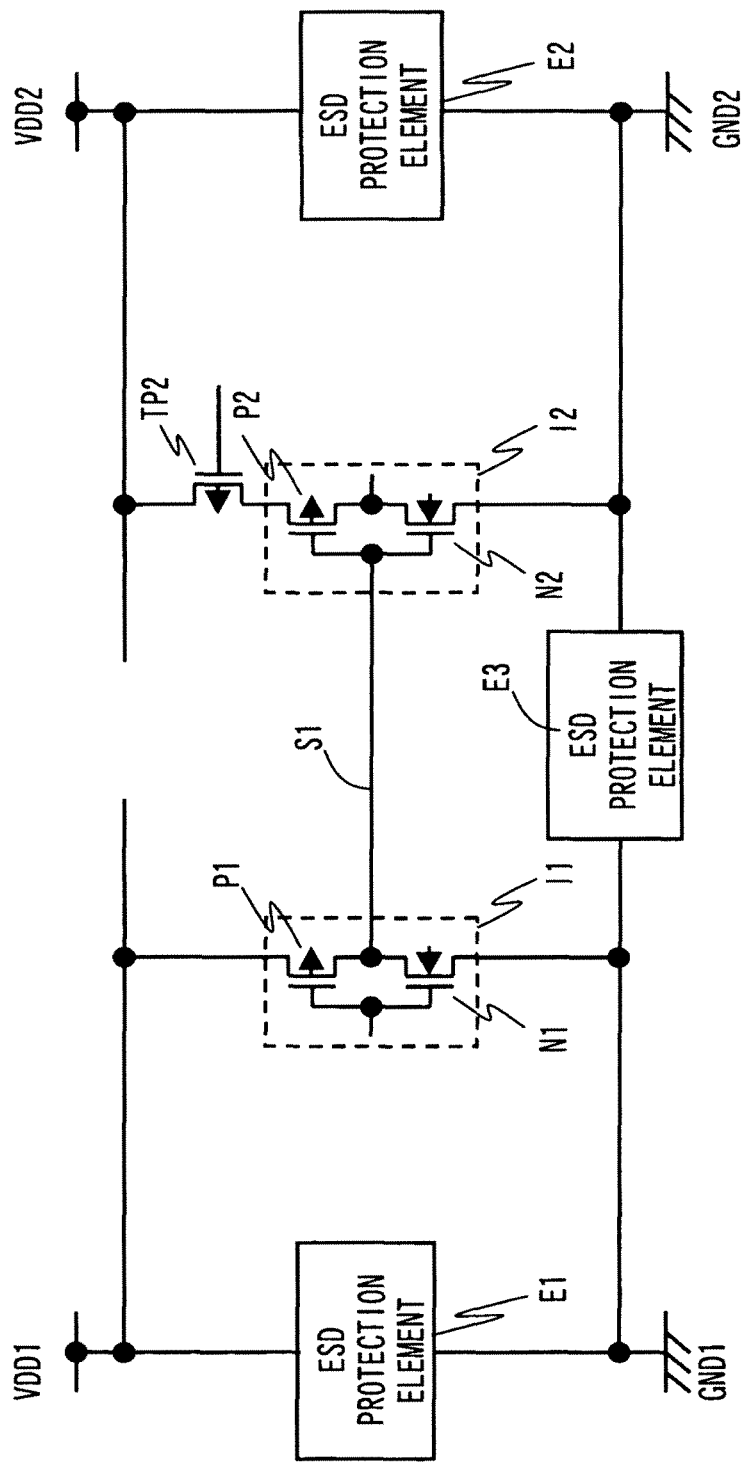
FIG. 11 is a diagram showing a configuration of a circuit according to a fourth embodiment of the present invention.

FIG. 11 is a diagram showing a configuration of a circuit of a semiconductor device according to a fourth embodiment of the present invention. Referring to FIG. 11, same reference numerals are assigned to components that are the same as those in FIG. 1, and descriptions of the same components will be omitted. Referring to FIG. 11, a PMOS transistor TP2 connected between the PMOS transistor P2 of the input inverter circuit I2 and the power supply terminal VDD2 is arranged.

Next, an operation of the fourth embodiment of the present invention will be described. The input inverter circuit I2 in the second power supply system is composed by the NMOS transistor N2 and the PMOS transistor P2. Between the PMOS transistor P2 and the power supply terminal VDD2, the PMOS transistor TP2 is connected.

Referring to FIG. 11, when the ESD stress is applied to the power supply terminal VDD2 with the ground terminal GND1 as a reference point, for example, a current that flows into the PMOS transistor P2 can be restrained by arranging and controlling the PMOS transistor TP2. As a result, an increase in a source potential of the PMOS transistor P2 is restrained, and a potential difference Vgs applied between the gate of the PMOS transistor P2 of the input inverter circuit I2 and the source of the PMOS transistor P2 can be limited within the voltage that might cause the breakdown of the gate oxide film of the PMOS transistor P2. The breakdown of the gate of the PMOS transistor P2 can be thereby prevented, and a stable ESD withstand voltage can be obtained. Meanwhile, electric charge applied to the power supply terminal VDD2 by the ESD stress application is discharged to the ground terminal GND1 through the ESD protection elements E2 and E3.

Figure 12:
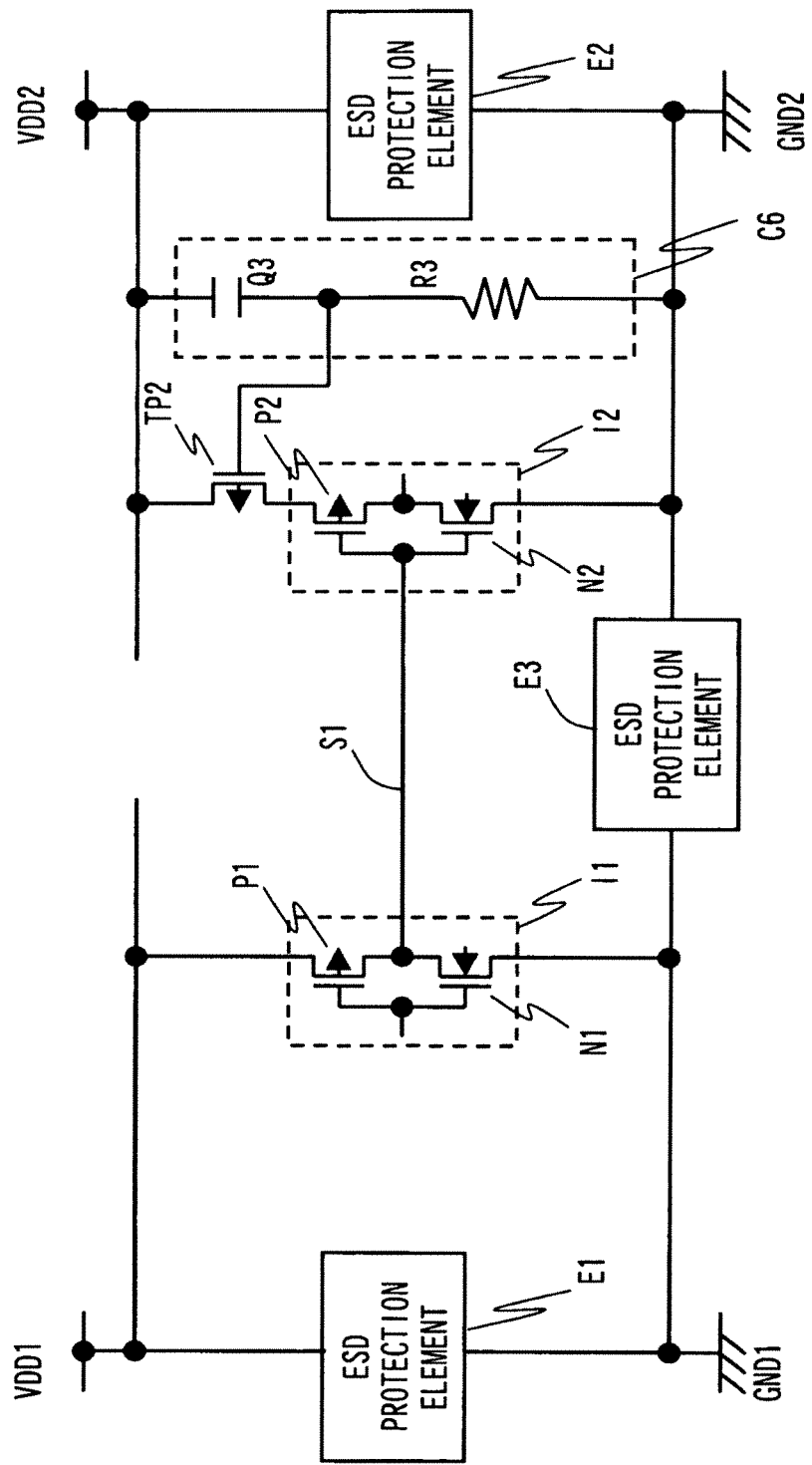
FIG. 12 is a diagram showing an example of a configuration of a control circuit in the fourth embodiment of the present invention.

FIG. 12 is a diagram showing a configuration of a circuit in which a circuit C6 that controls a gate of the PMOS transistor TP2 is provided in the fourth embodiment of the present invention. Referring to FIG. 12, same reference numerals are assigned to components that are the same as those in FIG. 11. Below, descriptions of the same components will be omitted as necessary, and a description will mainly directed to a difference. The control circuit C6 has the same configuration as the control circuit C1 in FIG. 2.

In the control circuit C6, a resistance element R3 is connected between the gate of the PMOS transistor TP2 and the ground terminal GND2, and a capacitance element Q3 is connected between the gate of the PMOS transistor TP2 and the power supply terminal VDD2. When a normal operation is performed, the PMOS transistor TP2 becomes the ON state (conductive state) like the transistor in FIG. 2, and does not affect an operation of the circuit.

Referring to FIG. 12, when the ESD stress is applied to the power supply terminal VDD2 with the ground terminal GND1 as a reference point, the PMOS transistor TP2 becomes the OFF state according to an operation similar to that in FIG. 2. As a result, as described with reference to FIG. 11, the breakdown of the gate oxide film of the PMOS transistor P2 can be prevented.

Figure 13:
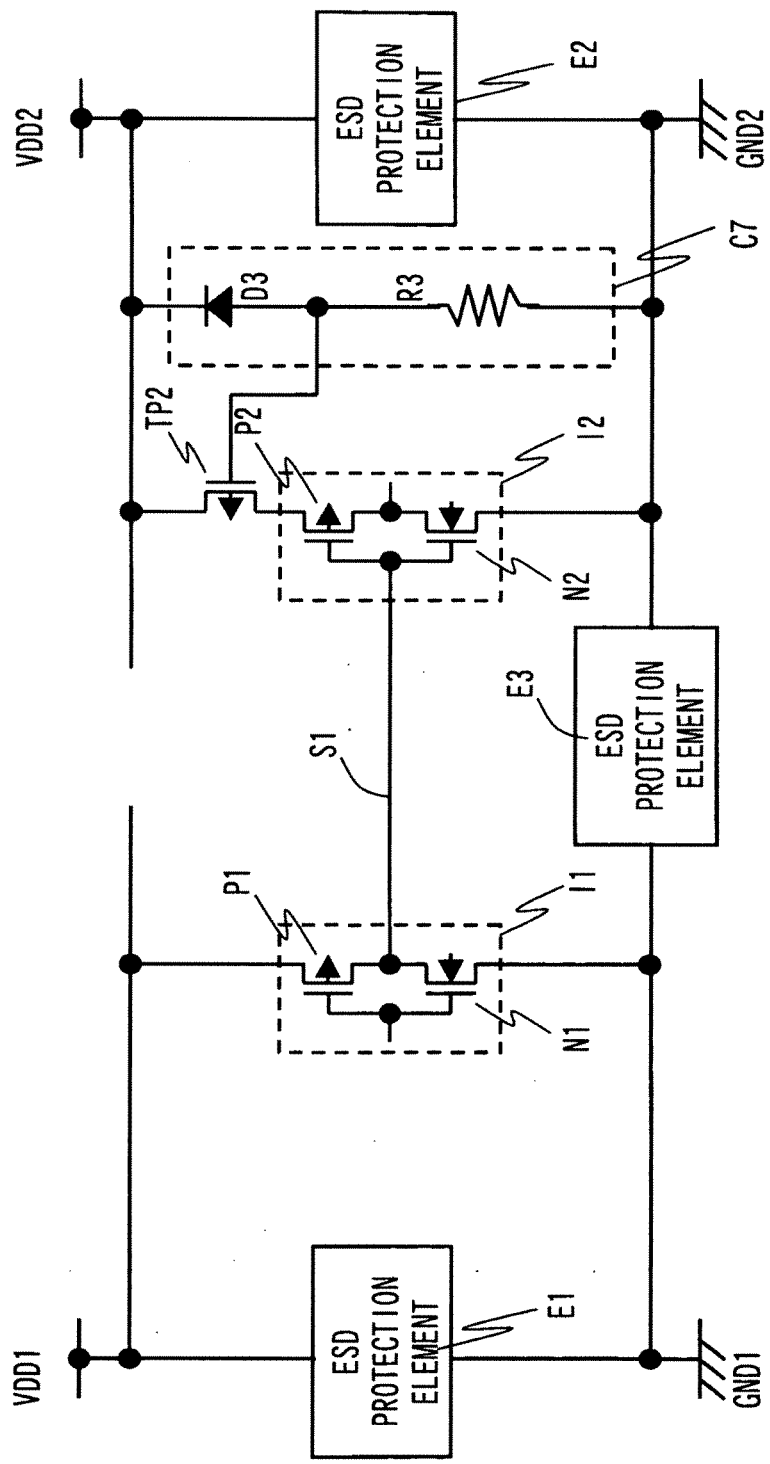
FIG. 13 is a diagram showing other configuration of the control circuit in the fourth embodiment of the present invention.

FIG. 13 is a diagram showing a configuration of a circuit where a control circuit C7, which is other configuration that controls the gate of the PMOS transistor TP2, is provided in the fourth embodiment of the present invention. The control circuit C7 has the same configuration as the control circuit C2 in FIG. 3.

Referring to FIG. 13, in the control circuit C7, the resistance element R3 is connected between the gate of the PMOS transistor TP2 and the ground terminal GND2, and a diode element D3 is connected between the gate of the PMOS transistor TP2 and the power supply terminal VDD2. The resistance element R3 and the diode element D3 are connected. When a normal operation is performed, the PMOS transistor TP2 becomes the ON state (conductive state) as in FIG. 12, and does not affect an operation of the circuit.

Referring to FIG. 13, when the ESD stress is applied to the power supply terminal VDD2 with the ground terminal GND1 as a reference point in the same manner as described before, the PMOS transistor TP2 becomes OFF state according to an operation similar to that in FIG. 3. As a result, as described with reference to FIG. 11, the breakdown of the gate oxide film of the PMOS transistor P2 can be prevented, as described with reference to FIG. 11.

As described above, in the fourth embodiment of the present invention, the PMOS transistor TP2 is provided between the PMOS transistor P2 of the input inverter circuit I2 and the power supply terminal VDD2. By controlling the gate of the PMOS transistor TP2, a current that flows into the PMOS transistor P2 can be limited, and an increase in the source potential of the PMOS transistor P2 can be restrained. The potential difference Vgs applied between the gate of the PMOS transistor P2 and the source of the PMOS transistor P2 in the input inverter circuit I2 can be therefore limited within the voltage that might cause the breakdown of the gate oxide film of the PMOS transistor P2. As a result, the number of the protection elements that prevent the breakdown of the gate oxide film can be reduced, or the protection element can be reduced in size.

In the second embodiment of the present invention, the NMOS transistor that limits the ESD current is provided between the output inverter circuit and the ground terminal GND1, thereby preventing the breakdown of the gate of the PMOS transistor P2. In the fourth embodiment of the present invention, the PMOS transistor that limits the ESD current is provided between the input inverter circuit and the power supply terminal VDD2. The current that flows into the PMOS transistor P2 can be thereby limited, and the potential difference Vgs applied to the gate oxide film of the PMOS transistor P2 of the input inverter circuit I2 can be reduced to a voltage that might cause the breakdown of the gate oxide film, or less. For this reason, when the ESD stress is applied to the power supply terminal VDD2 with the ground terminal GND1 as the reference point, for example, the breakdown of the gate of the PMOS transistor P2 can be prevented.

Fifth Embodiment

Figure 14:
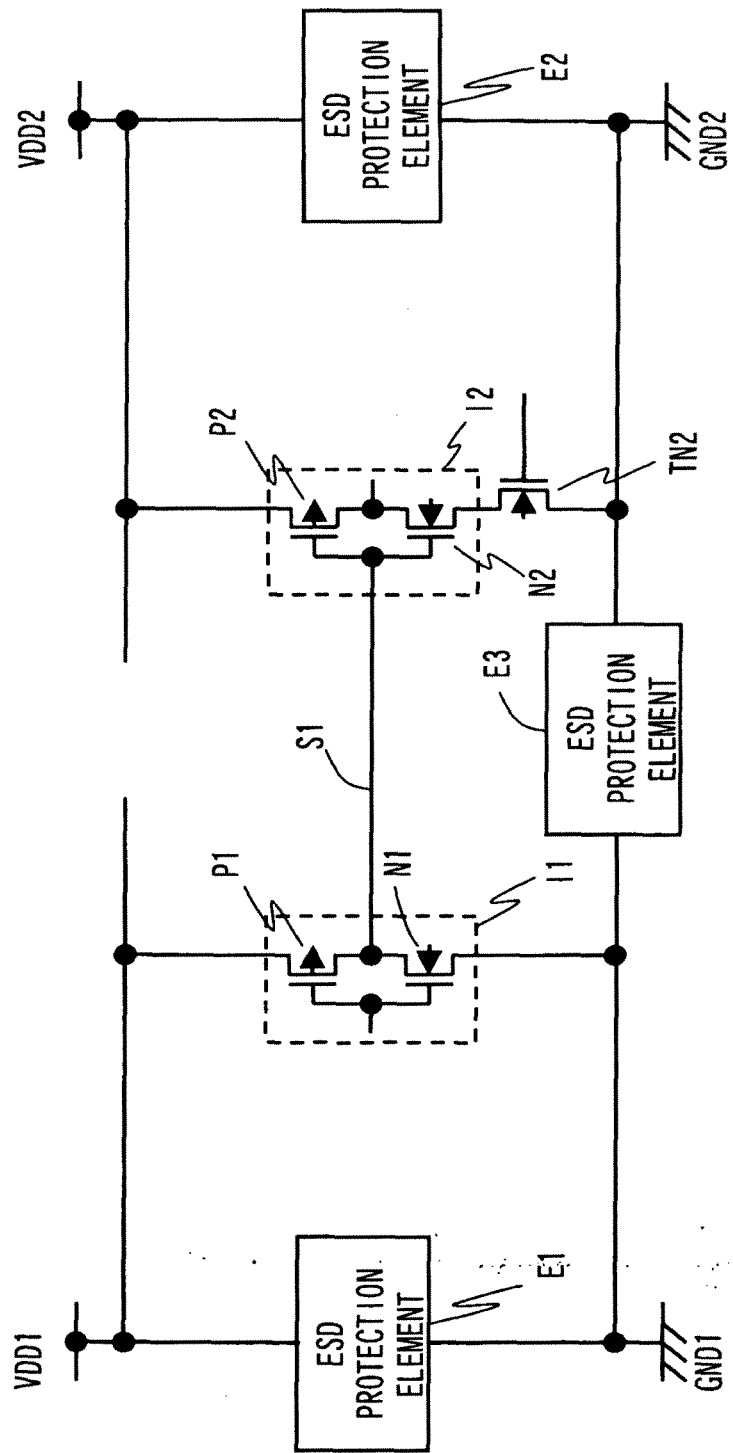
FIG. 14 is a diagram showing a configuration of a circuit according to a fifth embodiment of the present invention.

FIG. 14 is a diagram showing a configuration of a circuit of a semiconductor device according to a fifth embodiment of the present invention. Referring to FIG. 14, same reference numerals are assigned to components that are the same as those in FIG. 1. Below, descriptions of the same components will be omitted as necessary, and a description will be mainly directed to a difference.

While there is provided the PMOS transistor TP1 connected between the PMOS transistor P1 of the output inverter circuit I1 and the power supply terminal VDD1 in FIG. 1, the NMOS transistor TN2 connected between the NMOS transistor N2 of the input inverter circuit I2 and the ground terminal GND2 is provided in the configuration in FIG. 14.

That is, referring to FIG. 14, the input inverter circuit I2 in the second power supply system is composed by the NMOS transistor N2 and a PMOS transistor P2, and the NMOS transistor TN2 is connected between the NMOS transistor N2 and the ground terminal GND2.

Referring to FIG. 14, when the ESD stress is applied to the ground terminal GND2 with the power supply terminal VDD1 as a reference point, for example, a current that flows into the NMOS transistor N2 can be restrained by arranging and controlling the NMOS transistor TN2. As a result, an increase in a source potential of the NMOS transistor N2 is restrained, and the potential difference Vgs applied between the gate of the NMOS transistor N2 of the input inverter circuit I2 and the source of the NMOS transistor N2 can be limited within the voltage that might cause the breakdown of the gate oxide film of the NMOS transistor N2. The breakdown of the gate of the NMOS transistor N2 can be thereby prevented, and a stable ESD withstand voltage can be obtained. Electric charge applied to the ground terminal GND2 by the ESD stress application is discharged to the power supply terminal VDD1 through the ESD protection elements E3 and E1.

Figure 15:
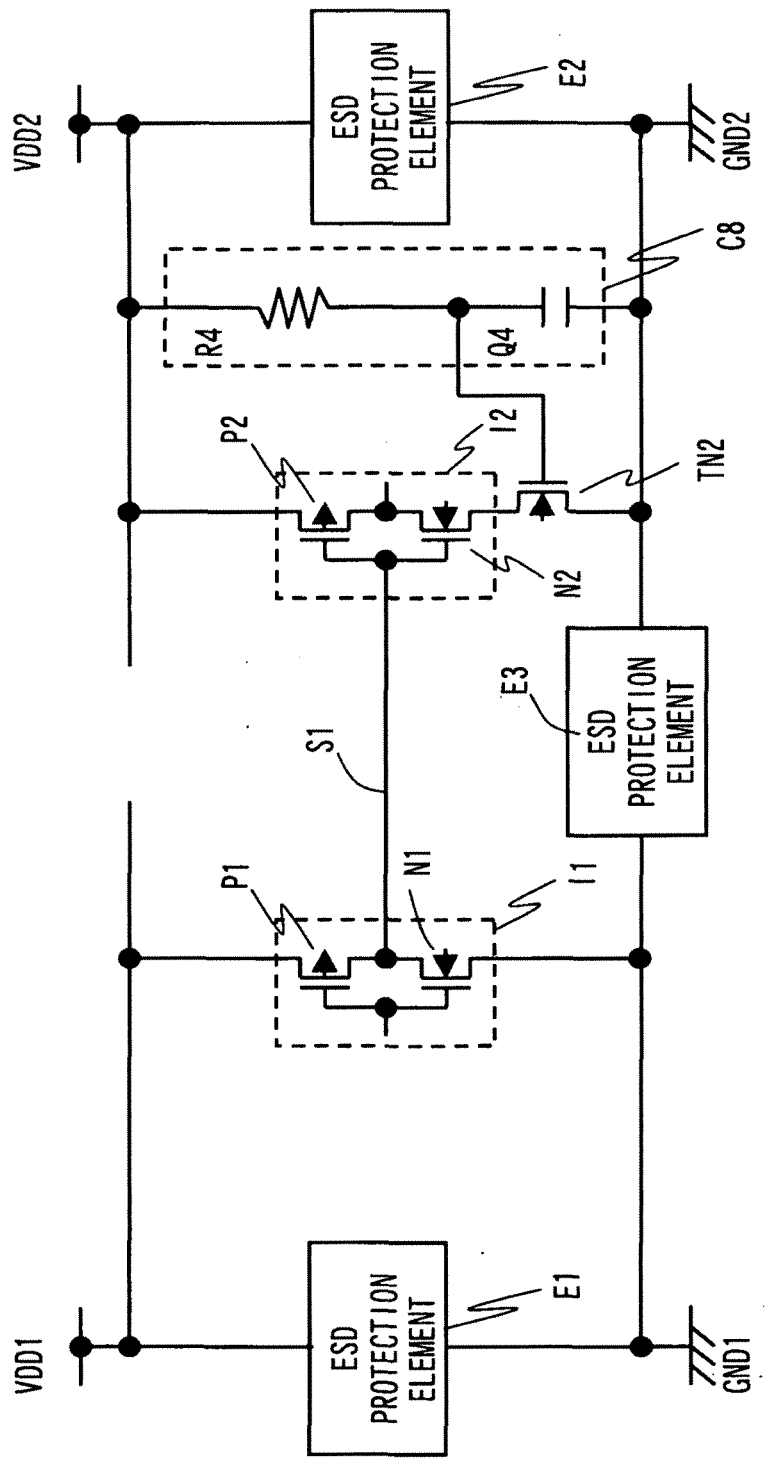
FIG. 15 is a diagram showing an example of a configuration of a control circuit in the fifth embodiment of the present invention.

FIG. 15 is a diagram showing a configuration of a circuit in which a circuit C8 that controls the gate of the NMOS transistor TN2 is provided in a semiconductor device in the fifth embodiment of the present invention. Referring to FIG. 15, same reference numerals are assigned to components that are the same as those in FIG. 14. Below, descriptions of the same components will be omitted as necessary, and a description will mainly directed to a difference. The control circuit C8 has the same configuration as the control circuit C3 in FIG. 6.

Referring to FIG. 15, in the control circuit C8, a resistance element R4 is connected between the gate of the TMOS transistor TN2 and the power supply terminal VDD2, and a capacitance element Q4 is connected between the gate of the TMOS transistor TN2 and the ground terminal GND2. When a normal operation is performed, the TMOS transistor TN2 becomes the ON state (conductive state) as in FIG. 6, and does not affect an operation of the circuit.

Referring to FIG. 15, when the ESD stress is applied to the ground terminal GND2 with the power supply terminal VDD1 as a reference point, the NMOS transistor TN2 becomes the OFF state according to an operation similar to that in FIG. 6. As a result, as described with reference to FIG. 14, the breakdown of the gate oxide film of the NMOS transistor N2 can be prevented.

Figure 16:
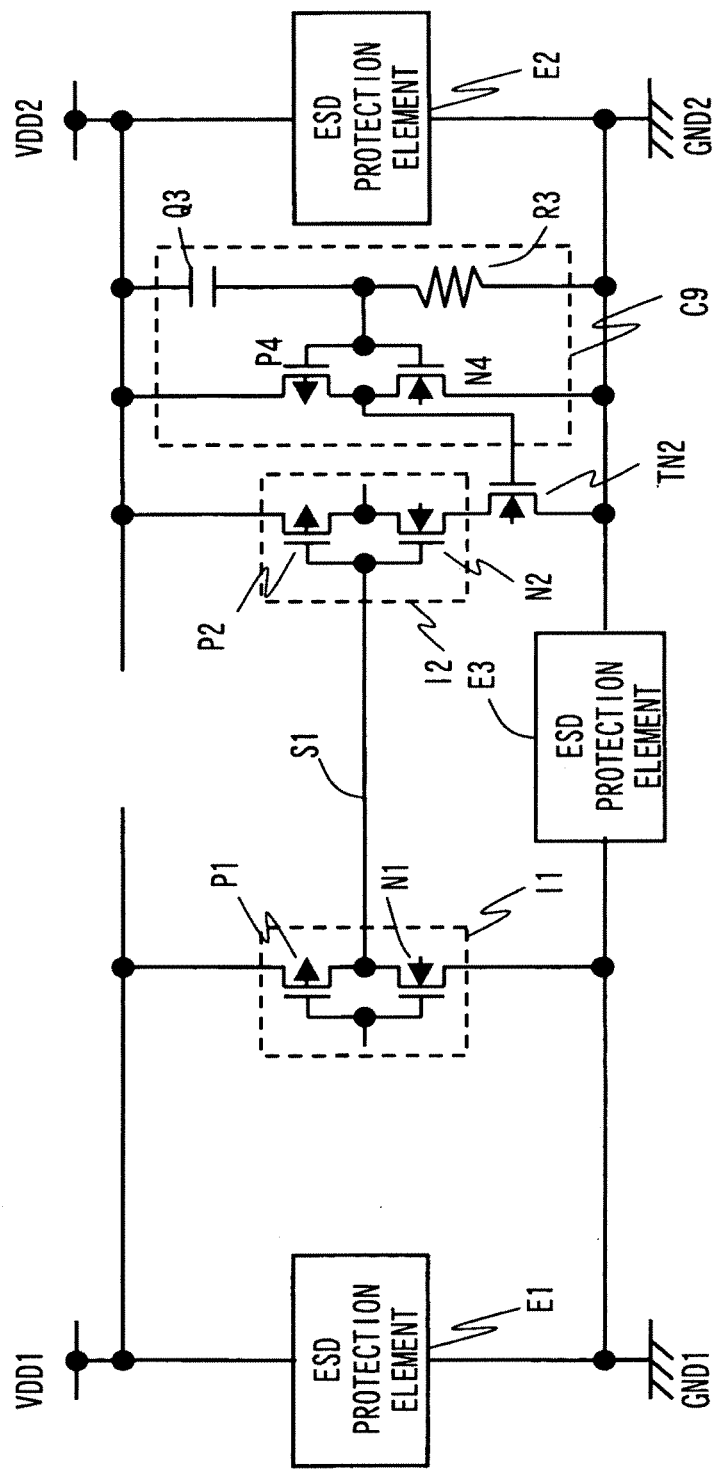
FIG. 16 is a diagram showing other configuration of the control circuit in the fifth embodiment of the present invention.

FIG. 16 is a diagram showing a configuration of a circuit in which a control circuit C9, which has other configuration that controls the gate of the NMOS transistor TN2, is provided in a semiconductor device in the fifth embodiment of the present invention. Since the control circuit C9 has the same configuration as the control circuit C4 in FIG. 7, a description of the control circuit C9 will be omitted.

Referring to FIG. 16, when a normal operation is performed, the NMOS transistor TN2 becomes the ON state (conductive state) as in FIG. 15 and does not affect an operation of the circuit.

Referring to FIG. 16, when the ESD stress is applied to the ground terminal GND2 with the power supply terminal VDD1 as a reference point, the NMOS transistor TN2 becomes the OFF state due to an operation similar to that in FIG. 7. As a result, as described with reference to FIG. 14, the breakdown of the gate of the NMOS transistor N2 can be prevented.

As described above, in the fifth embodiment of the present invention, the NMOS transistor TN2 is provided between the NMOS transistor N2 of the input inverter circuit I2 and the ground terminal GND2, and the gate of the NMOS transistor TN2 is controlled. Thus, the current that flows into the NMOS transistor N2 can be limited, and the increase in the source potential of the NMOS transistor N2 can be thereby restrained. The potential difference Vgs applied between the gate of the NMOS transistor N2 in the input inverter circuit I2 and the source of the NMOS transistor N2 can be limited within the voltage that might cause the breakdown of the gate oxide film of the NMOS transistor N2. As a result, the number of the protection elements that prevent the breakdown of the gate oxide film can be reduced, or the protection element can be reduced in size.

In the first embodiment of the present invention, the PMOS transistor that limits the ESD current is provided between the output inverter circuit and the power supply terminal VDD1, thereby preventing the breakdown of the gate of the NMOS transistor N2. In the fifth embodiment of the present invention, the NMOS transistor that limits the ESD current is provided between the input inverter circuit and the ground terminal GND2. The current that flows into the NMOS transistor N2 can be thereby limited, and the potential difference Vgs applied to the gate oxide film of the NMOS transistor N2 of the input inverter circuit I2 can be reduced to a voltage that might cause the breakdown of the gate oxide film, or less. For this reason, when the ESD stress is applied to the ground terminal GND2 with the power supply terminal VDD1 as the reference point, the breakdown of the gate of the NMOS transistor N2 can be prevented.

Sixth Embodiment

Figure 17:
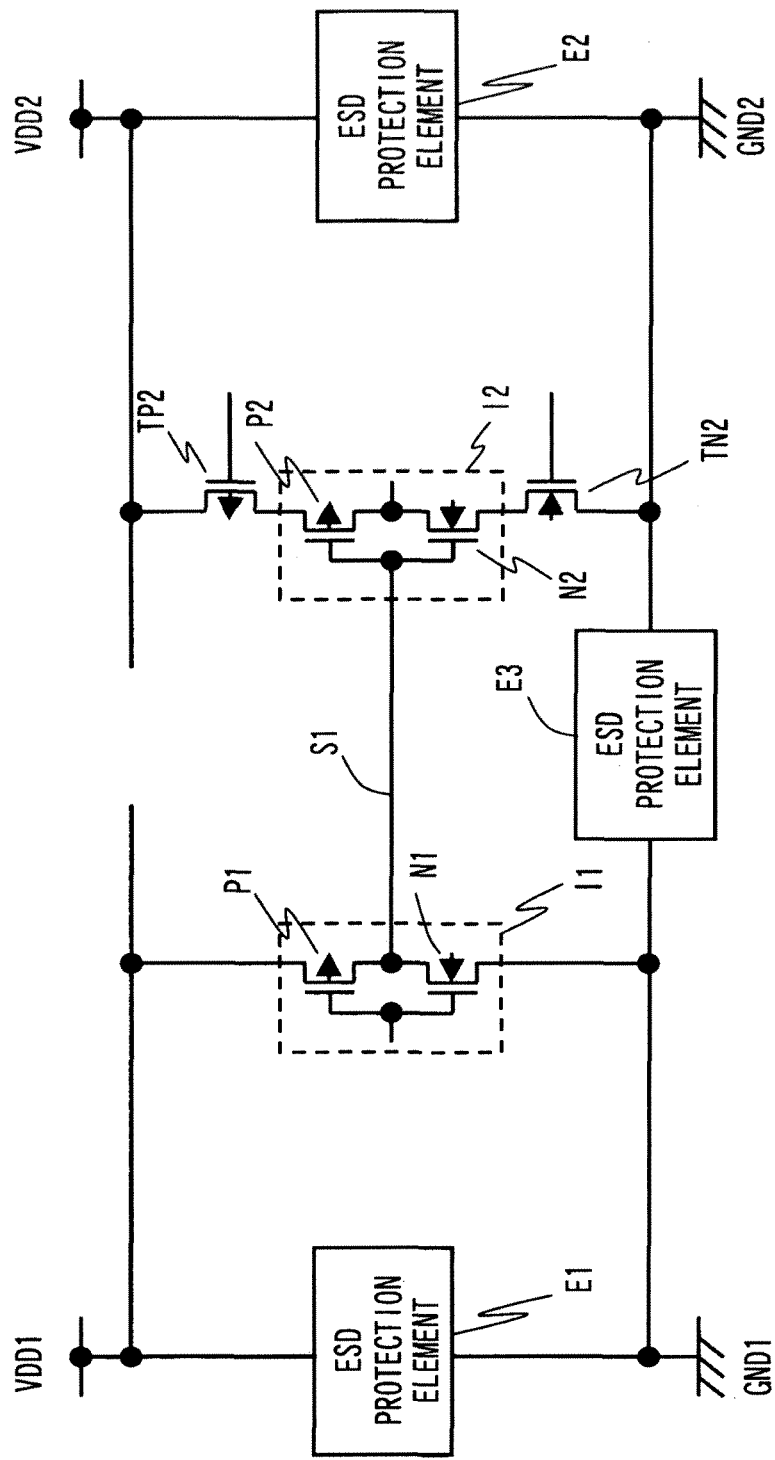
FIG. 17 is a diagram showing a configuration of a circuit according to a sixth embodiment of the present invention.

FIG. 17 is a diagram showing a configuration of a circuit of a semiconductor device according to a sixth embodiment of the present invention. FIG. 17 is configured to combine the fourth embodiment shown in FIG. 11 with the fifth embodiment shown in FIG. 14. Same reference numerals are assigned to components that are the same as those in FIGS. 11 and 14. Below, descriptions of the same components will be omitted, and a description will be directed to a difference.

Referring to FIG. 17, the input inverter circuit I2 in the second power supply system is composed by the NMOS transistor N2 and the PMOS transistor P2. The PMOS transistor TP2 is connected between the PMOS transistor P2 and the power supply terminal VDD2, and the NMOS transistor TN2 is connected between the NMOS transistor N2 and the ground terminal GND2.

Referring to FIG. 17, when the ESD stress is applied to the power supply terminal VDD2 with the ground terminal GND1 as a reference point, for example, the same effect as that in FIG. 11 is obtained. When the ESD stress is applied to the ground terminal GND2 with the power supply terminal VDD1 as a reference point as well, the same effect as that in FIG. 14 is obtained.

Figure 18:
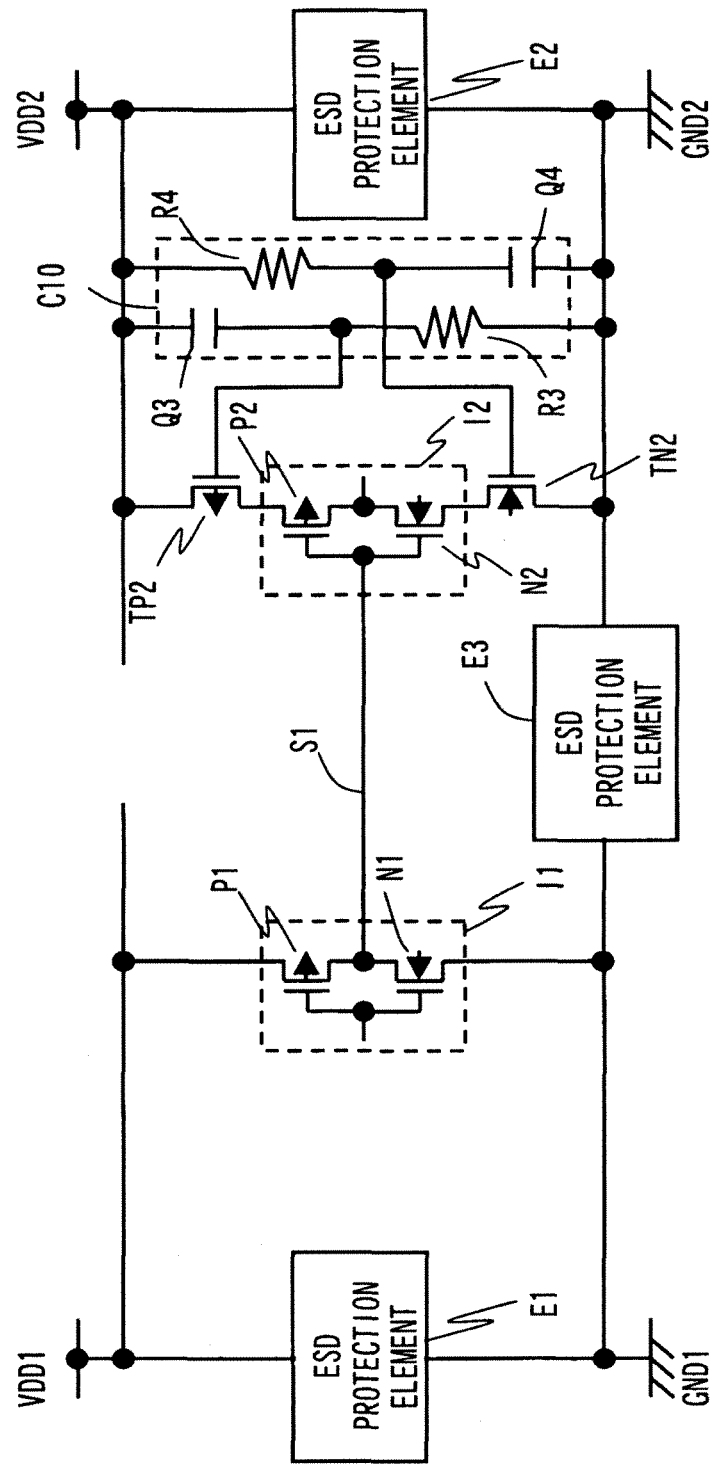
FIG. 18 is a diagram showing an example of a configuration of a control circuit in the sixth embodiment of the present invention.

FIG. 18 is a diagram showing a configuration of a circuit in which a circuit C10 that controls the gate of the PMOS transistor TP2 and the gate of the NMOS transistor TN2 is provided in a semiconductor device in the sixth embodiment of the present invention. The control circuit C10 combines the control circuit C6 shown in FIG. 12 and the control circuit C8 shown in FIG. 15. Referring to FIG. 18, same reference numerals are assigned to components that are the same as those in FIGS. 12 and 15. Below, descriptions of the same components will be omitted as necessary, and a description will mainly directed to a difference.

Referring to FIG. 18, the PMOS transistor TP2 is connected between the PMOS transistor P2 of the output inverter circuit I2 and the power supply terminal VDD2, and the NMOS transistor TN2 is connected between the NMS transistor N2 of the output inverter circuit I2 and the ground terminal GND2. To the gates of the NMOS transistor TN2 and the PMOS transistor TP2, the circuit C10 that controls potentials of the gates of the NMOS transistor TN2 and the PMOS transistor TP2 is connected.

The control circuit C10 comprises a capacitance element Q3 connected between the gate of the PMOS transistor TP2 and the power supply terminal VDD2, a resistance element R3 connected between the capacitance element Q3 and the ground terminal GND2, a resistance element R4 connected between the gate of the NMOS transistor TN2 and the power supply terminal VDD2, and a capacitance element Q4 connected between the resistance element R4 and the ground terminal GND2.

The control circuit C10 operates as in FIGS. 12 and 15. When a normal operation is performed, the PMOS transistor TP2 and the NMOS transistor TN2 become the ON states (conductive states), respectively, and do not affect an operation of the circuit.

Referring to FIG. 18, when the ESD stress is applied to the power supply terminal VDD2 with the ground terminal GND1 as a reference point, the same effect as that in FIG. 12 is obtained. When the ESD stress is applied to the ground terminal GND2 with the power supply terminal VDD1 as a reference point as well, the same effect as that in FIG. 15 is obtained.

Figure 19:
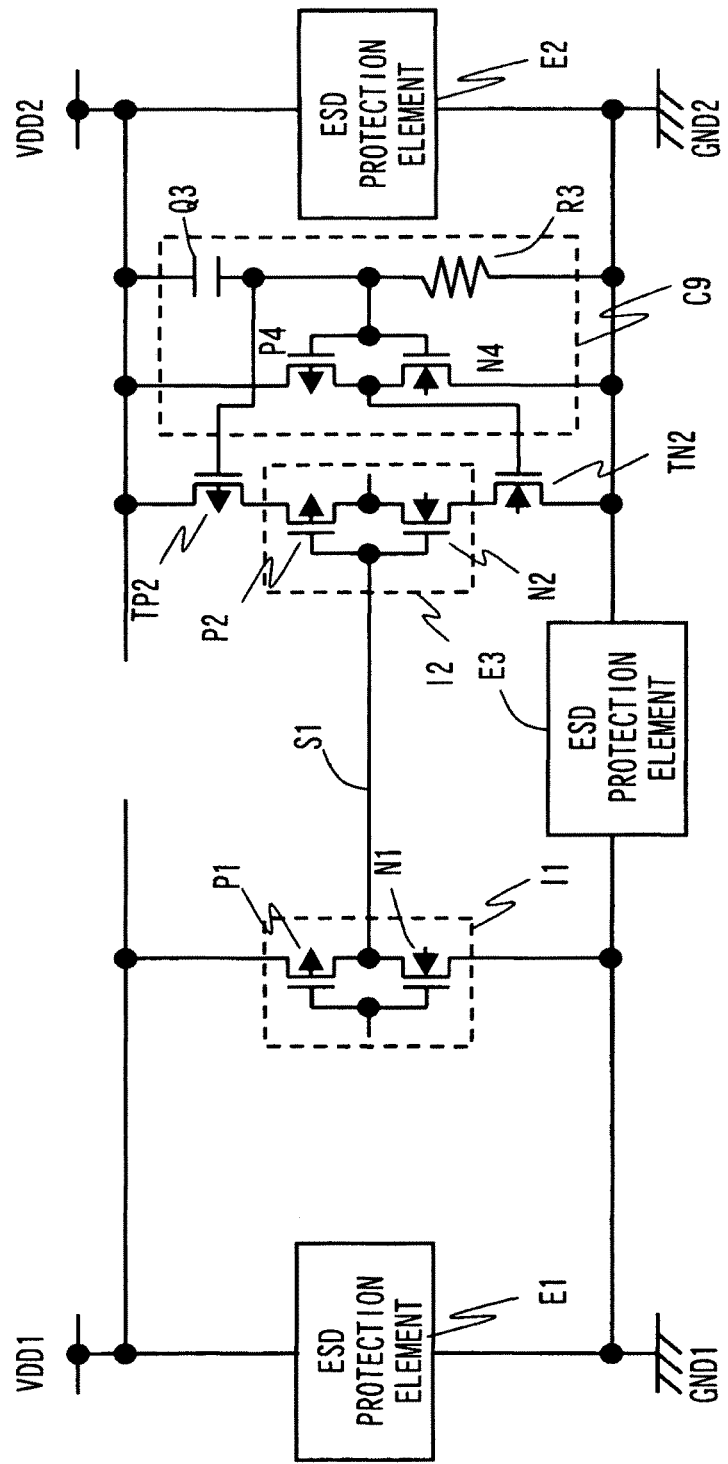
FIG. 19 is a diagram showing other configuration of the control circuit in the sixth embodiment of the present invention.

FIG. 19 is a diagram showing a configuration of a circuit in which the circuit C9, which is other configuration that controls the gate of the PMOS transistor TP2 and the gate of the NMOS transistor TN2, is provided in a semiconductor device in the sixth embodiment of the present invention. The configuration of the control circuit C9 is the same as that in FIG. 16.

FIG. 19 combines FIGS. 12 and 16. As in FIGS. 12 and 16, the NMOS transistor TN2 and the PMOS transistor TP2 become the ON states (conductive states), respectively, when a normal operation is performed, and do not affect an operation of the circuit.

Referring to FIG. 19, when the ESD stress is applied to the power supply terminal VDD2 with the ground terminal GND1 as a reference point, or when the ESD stress is applied to the ground terminal GND2 with the power supply terminal VDD1 as a reference point, for example, the same effect as that in FIG. 18 is obtained.

As described above, in the sixth embodiment of the present invention, due to the same effect as those in the fourth and fifth embodiments, the breakdown of the gate oxide film of the PMOS transistor P2 or the NMOS transistor N2 of the input inverter circuit I2 can be prevented. As a result, the number of the protection elements can be reduced, or the protection element can be reduced in size.

According to the sixth embodiment of the present invention, the transistors are provided between the input inverter circuit and the power supply terminal and between the input inverter circuit and the ground terminal, respectively. In both cases where the ESD stress is applied from the terminal VDD2 to the terminal GND1 and the ESD stress is applied from the terminal GND2 to the terminal VDD1, the breakdown of the gates of the PMOS transistor P2 and the NMOS transistor N2 that constitute the input inverter circuit I2 can be thereby prevented. The sixth embodiment provides more excellent protection capability than the fourth and fifth embodiments of the present invention.

Seventh Embodiment

Figure 22:
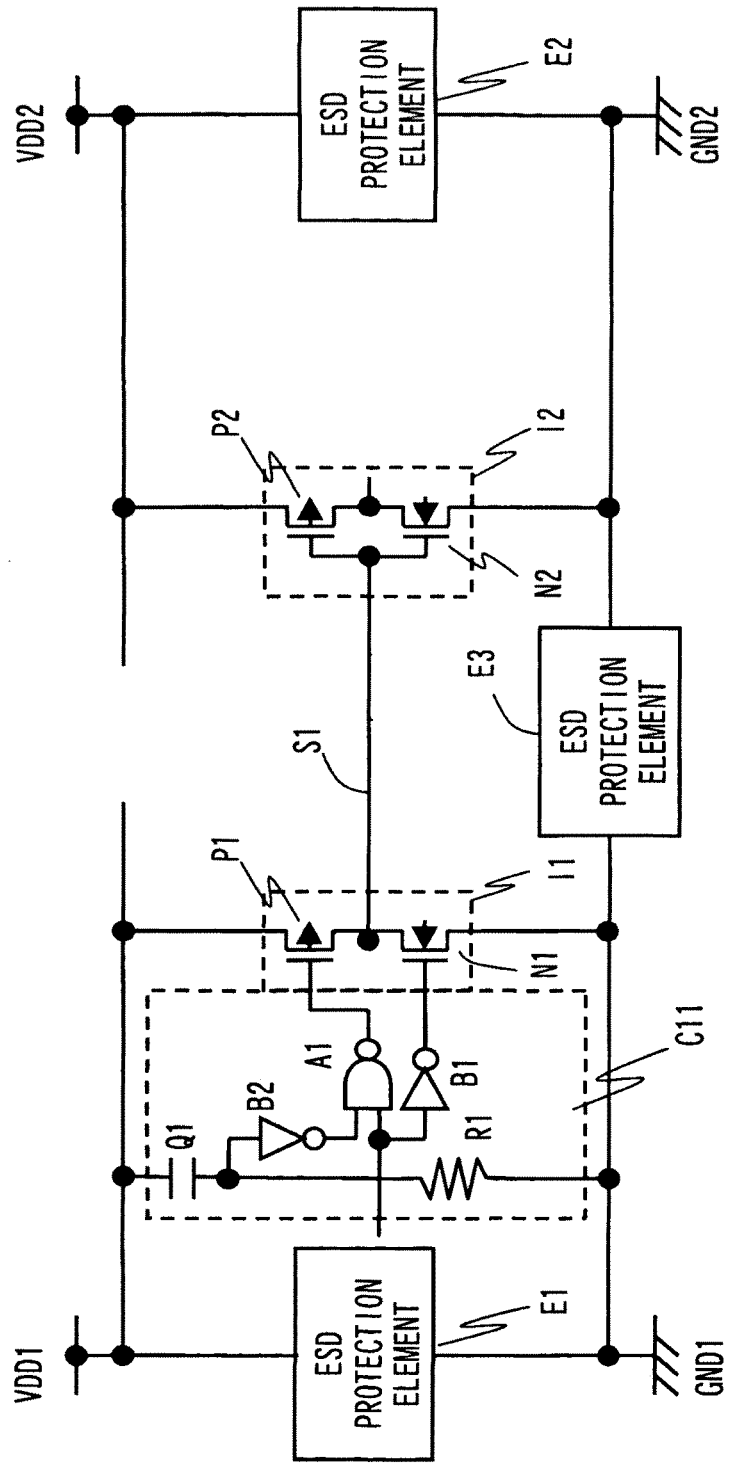
FIG. 22 is a diagram showing a configuration of a circuit according to a seventh embodiment of the present invention.

FIG. 22 is a diagram showing a configuration of a circuit of a semiconductor device according to a seventh embodiment of the present invention. Referring to FIG. 22, same reference numerals are assigned to components that are the same as those in FIG. 1. Descriptions of the same components will be omitted, and a description will be mainly directed to a difference. FIG. 22 shows the circuit configuration in which a circuit C11 that controls a gate of the PMOS transistor P1 in the output inverter circuit I1 is provided.

Referring to FIG. 22, in the control circuit C11, a capacitance element Q1 and a resistance element R1 are connected in series between the power supply terminal VDD1 and the ground terminal GND1. Between the PMOS transistor P1 and a node between the capacitance element Q1 and the resistance element R1, an inverter circuit B2 and a NAND circuit A1 are connected in series. An inverter element B1 is connected to a gate of the NMOS transistor N1.

The output inverter circuit I1 in the first power supply system is composed by the NMOS transistor N1 and the PMOS transistor P1.

Since the gate of the PMOS transistor P1 is connected to the ground terminal GND1 through the NAND circuit A1, inverter circuit B2, and resistance element R1, the gate of the PMOS transistor P1 is controlled by a value of an input signal (input signal to be output from the output circuit) to the NAND circuit A1.

The gate of the NMOS transistor N1 is connected to the input signal to the NAND circuit A1 through the inverter circuit B1. Accordingly, an output signal of the output inverter circuit I1 is controlled by the input signal to the NAND circuit A1, and does not affect an operation of the circuit.

Referring to FIG. 22, when the ESD stress is applied to the power supply terminal VDD1 with the ground terminal GND2 as a reference point, for example, electric charge is charged into the capacitance element Q1. Then, due to coupling of the electric charge applied to the capacitance element Q1, a gate potential of a PMOS transistor (not shown) of the inverter circuit B2 becomes the same as a source potential of the PMOS transistor (not shown) of the inverter circuit B2. An output of the inverter circuit B2 therefore goes Low. Since an output of the NAND circuit A1 that receives the Low-level output of the inverter circuit B2 goes High, the gate of the PMOS transistor P1 becomes the OFF state. For this reason, a current that flows into the signal line S1 through the PMOS transistor P1 can be limited. The breakdown of the gate oxide film of the NMOS transistor N2 of the input inverter circuit I2 can be thereby prevented.

As described above, in the seventh embodiment of the present invention, a gate potential of the PMOS transistor P1 of the output inverter circuit I1 is controlled. The current that flows into the signal line S1 from the PMOS transistor P1 can be thereby restrained, and the potential difference Vgs applied between the gate of the NMOS transistor N2 of the input inverter circuit I2 and a source of the NMOS transistor N2 can be thereby limited within the voltage that might cause the breakdown of the gate oxide film of the NMOS transistor N2. As a result, the number of the protection elements ca be reduced, or the protection element can be reduced in size.

In the seventh embodiment of the present invention, by controlling the PMOS transistor P1 of the output inverter circuit I1 itself, driving capability can be more enhanced as compared with the first embodiment of the present invention.

Eighth Embodiment

Figure 23:
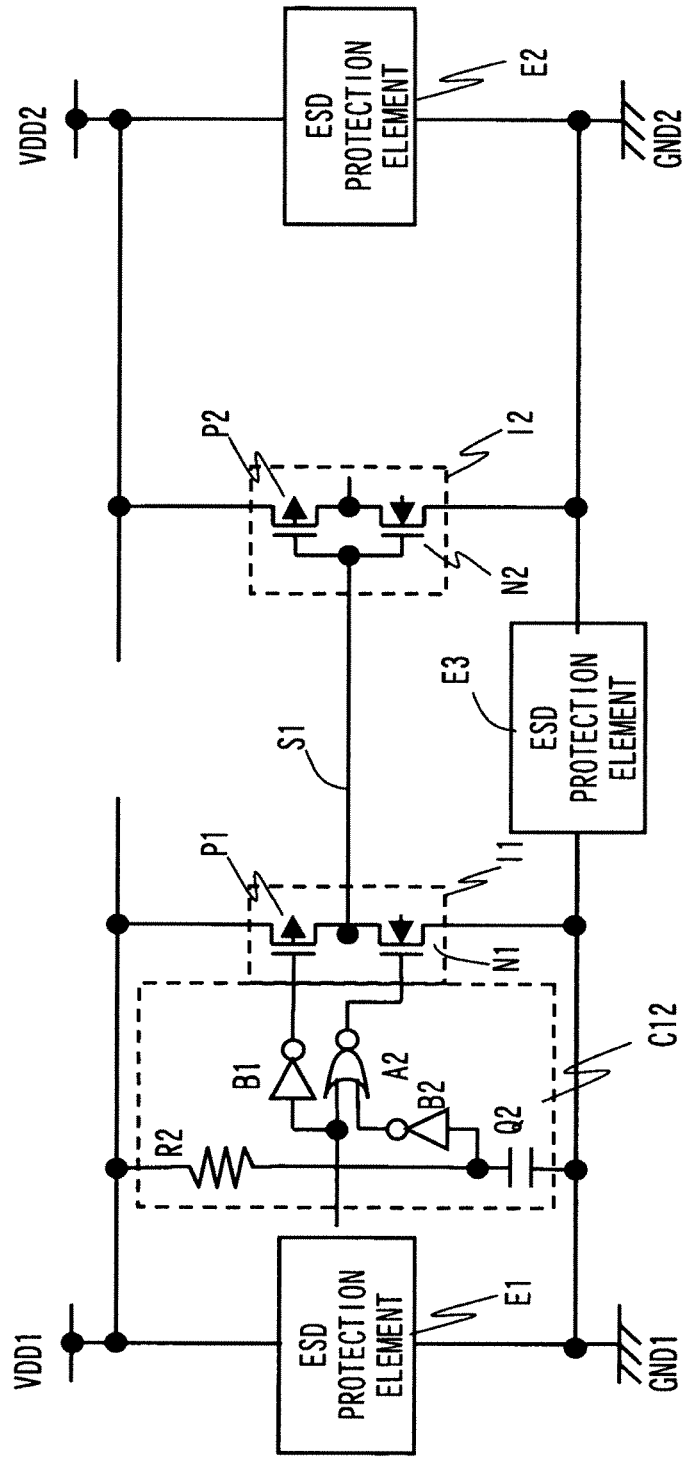
FIG. 23 is a diagram showing a configuration of a circuit according to an eighth embodiment of the present invention.

FIG. 23 is a diagram showing a configuration of a circuit according to an eighth embodiment of the present invention. Referring to FIG. 23, same reference numerals are assigned to components that are the same as those in FIG. 1. Below, descriptions of the same components will be omitted as necessary, and a description will be mainly directed to a difference.

Referring to FIG. 23, the present embodiment includes a circuit C12 that controls the gate of the NMOS transistor N1 of the output inverter circuit I1.

In the control circuit C12, a capacitance element Q2 and a resistance element R2 are connected in series between the power supply terminal VDD1 and the ground terminal GND1. Between the NMOS transistor N1 and a node between the capacitance element Q2 and the resistance element R2, an inverter circuit B2 and a NOR circuit A2 are connected in series. An inverter element B1 is connected to the gate of the PMOS transistor P1.

The output inverter circuit I1 in the first power supply system is composed by the NMOS transistor N1 and the PMOS transistor P1. Since the gate of the NMOS transistor N1 is connected to the power supply terminal VDD1 through the NOR circuit A2, inverter circuit B2, and resistance element R2, the gate of the NMOS transistor N1 is controlled by an input signal to the NOR circuit A2 when a normal operation is performed.

The gate of the PMOS transistor P1 is connected to the input signal to the NOR circuit A2 through the inverter circuit B1. Accordingly, an output signal of the output inverter circuit I1 is controlled by the input signal to the NOR circuit A2, and does not affect an operation of the circuit.

Referring to FIG. 23, when the ESD stress is applied to the ground terminal GND1 with the power supply terminal VDD2 as a reference point, for example, electric charge is charged into the capacitance element Q2. Then, due to coupling of the electric charge charged in the capacitance element Q2, a gate potential of an NMOS transistor of the inverter circuit B2 becomes the same as a source potential of the NMOS transistor of the inverter circuit B2. An output of the inverter circuit B2 therefore goes High.

Since an output of the NOR circuit A2 therefore goes Low, the gate of the NMOS transistor N1 becomes the OFF state. A current that flows into the signal line S1 through the NMOS transistor N1 can be limited. The breakdown of the gate oxide film of the PMOS transistor P2 can be thereby prevented.

As described above, in the eighth embodiment of the present invention, the gate of the NMOS transistor N1 of the output inverter circuit I1 is controlled. The current that flows into the signal line S1 from the NMOS transistor N1 can be thereby restrained, and the potential difference Vgs applied between the gate of the PMOS transistor P2 of the input inverter circuit I2 and the source of the PMOS transistor P2 can be thereby limited within the voltage that might cause the breakdown of the gate oxide film of the PMOS transistor P2. As a result, the number of the protection elements can be reduced, or the protection element can be reduced in size.

In the eighth embodiment of the present invention, by controlling the NMOS transistor N1 of the output inverter circuit I1 itself, driving capability can be more enhanced as compared with the second embodiment of the present invention.

Ninth Embodiment

Figure 24:
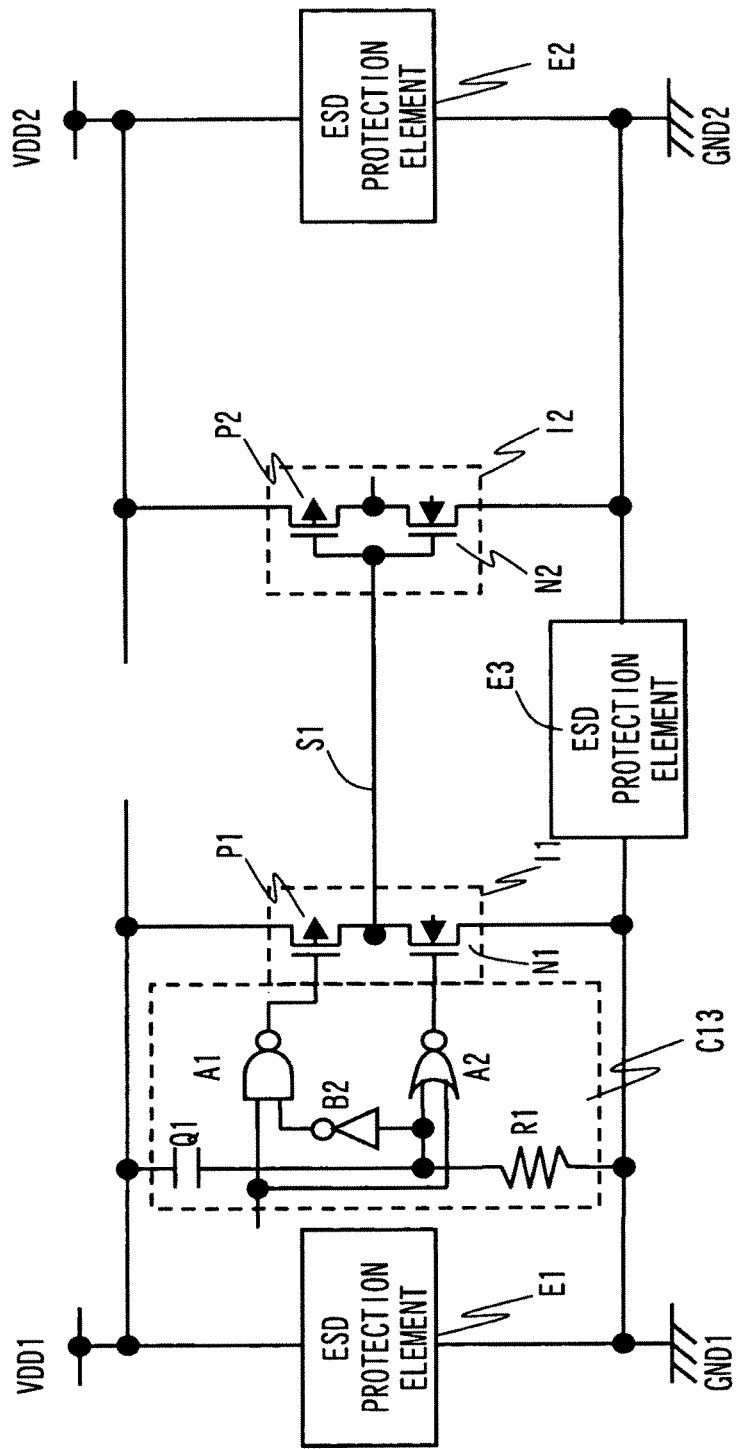
FIG. 24 is a diagram showing a configuration of a circuit according to a ninth embodiment of the present invention.
Figure 25:
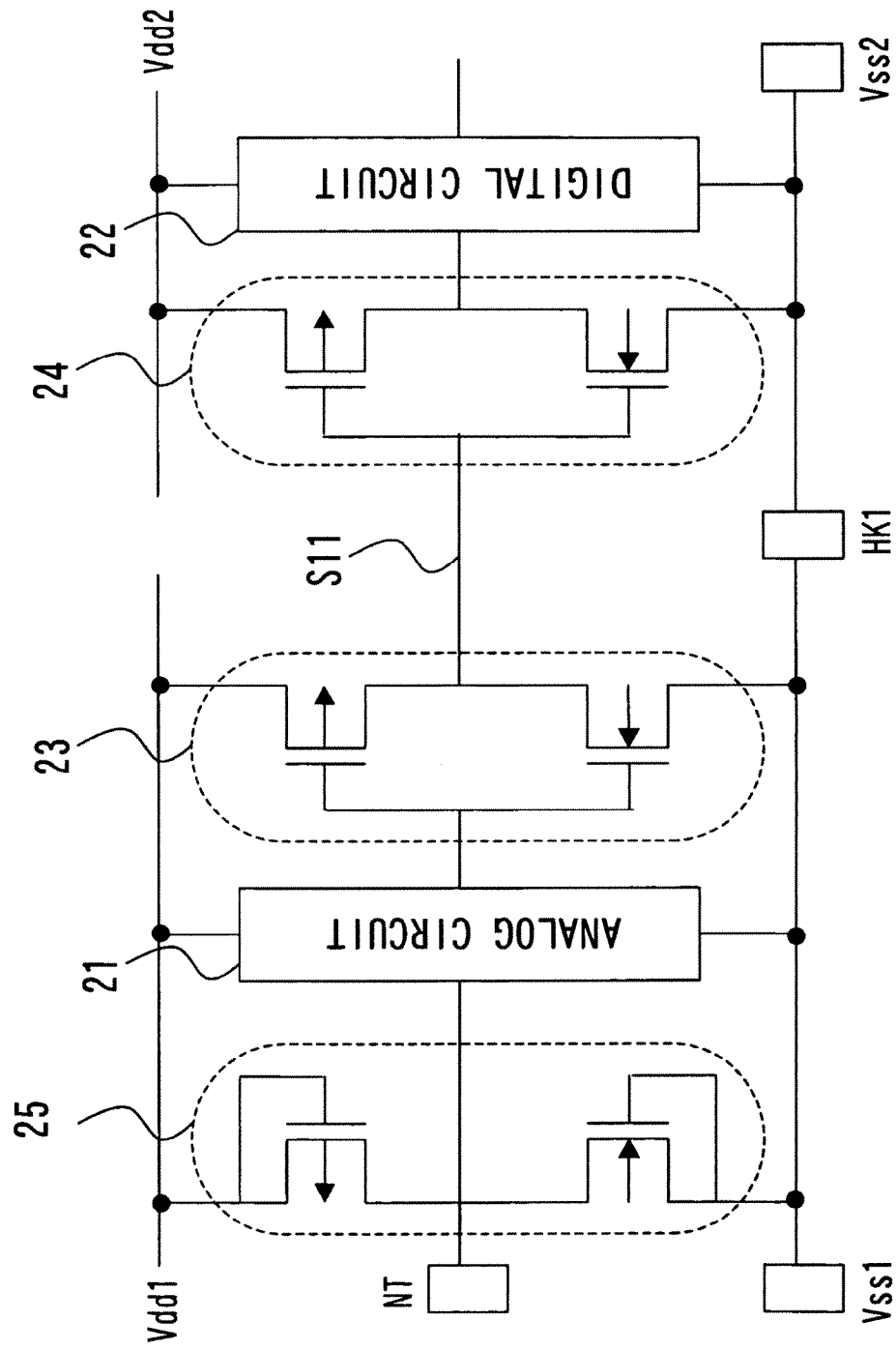
FIG. 25 is a diagram showing a configuration disclosed in Patent Document 1.

FIG. 24 is a diagram showing a configuration of a circuit according to a ninth embodiment of the present invention. Referring to FIG. 24, same reference numerals are assigned to components that are the same as those in FIG. 1. Below, descriptions of the same components will be omitted as necessary, and a description will be mainly directed to a difference below.

Referring to FIG. 24, the ninth embodiment includes a circuit C13 that controls the gates of the NMOS transistor N1 and the PMOS transistor P1 of the output inverter circuit I1.

In the control circuit C13, a capacitance element Q1 and a resistance element R1 are connected in series between the power supply terminal VDD1 and the ground terminal GND1. Between the PMOS transistor P1 and a node between the capacitance element Q1 and the resistance element R1, an inverter circuit B2 and a NAND circuit A1 are connected in series. A NOR circuit A2 is connected to the gate of the NMOS transistor N1. Ones of input nodes of the NAND circuit A1 and the NOR circuit A2 are connected through the inverter circuit B2, and the others of the input nodes are connected in series.

The output inverter circuit I1 in the first power supply system is composed by the NMOS transistor N1 and the PMOS transistor P1. A circuit formed by combination of the control circuit C13 with the output inverter circuit I1 becomes a three-state output circuit.

When a normal operation is performed, the gate of the PMOS transistor P1 is controlled by an input signal to the NAND circuit A1 as in the seventh embodiment.

Since the gate of the NMOS transistor N1 is connected to the ground terminal GND1 through the NOR circuit and the resistance element R1, the gate of the NMOS transistor N1 is controlled by an input signal to the NOR circuit A2. Accordingly, the NMOS transistor N1 does not affect an operation of the circuit.

Referring to FIG. 24, when the ESD stress is applied to the power supply terminal VDD1 with the ground terminal GND2 as a reference point, for example, the same effect as that in the seventh embodiment is obtained. Further, when the ESD stress is applied to the ground terminal GND1 with the power supply terminal VDD2 as a reference point, the same effect as that in the eighth embodiment is obtained.

As described above, in the ninth embodiment of the present invention, by controlling the gates of the PMOS transistor P1 and the NMOS transistor N1 of the output inverter circuit a current that flows from the PMOS transistor P1 or the NMOS transistor N1 into the signal line S1 can be restrained. The potential difference Vgs applied to the gate of the NMOS transistor N2 of the input inverter circuit I2 and the source of the NMOS transistor N2 can be limited within the voltage that might cause the breakdown of the gate oxide film of the NMOS transistor N2.

Further, the potential difference Vgs applied between the gate of the PMOS transistor P2 and the source of the PMOS transistor P2 can be limited within the voltage that might cause the breakdown of the gate oxide film of the PMOS transistor P2. As a result, the number of the protection elements can be reduced, or the protection element can be reduced in size.

In the ninth embodiment of the present invention, by controlling the PMOS transistor P1 and the NMOS transistor N1 of the output inverter circuit I1 themselves, the ninth embodiment provides more excellent protection capability as compared with the seventh and eighth embodiments of the present invention. In addition, driving capability can be more enhanced as compared with the third embodiment of the present invention.

According to the present invention, when a plurality of different power supply systems are provided and an output signal of a circuit of one power supply system is received by a circuit of the other power supply systems in the form of an input signal, an arrangement that prevents a gate breakdown of the input circuit for receiving the input signal is adopted. The number of the protection elements provided in a conventional device or the like or downsizing of the protection element can be performed. Accompanying this advantage, a parasitic capacitance element of the protection element is reduced, so that an improvement in response at a high speed operation is expected. Naturally, the present invention can also be applied to a device constituted from a plurality of chips which have powers supplied from different power supply systems respectively, in addition to a configuration in which an LSI includes a plurality of power supply systems.

The above description was given in connection with the embodiments described above. The present invention is not limited to the configurations of the embodiments described above, and of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed:

1. A protection circuit, comprising:
a first power supply system comprising a first power supply and a first ground;
a second power supply system comprising a second power supply and a second ground, the second power supply system being connected to the first power supply system via a signal line through which signal transfer is performed between a circuit in the first power supply system and a circuit in the second power supply system; and
a control circuit that, when coupled to an electro-static discharge (ESD) stress being applied to the first power supply system, controls a first switch,
wherein said first switch is provided between the signal line and the first ground, and
wherein the control circuit comprises a capacitance element, a resistance element in series with the capacitance element, and an inverter, an output of said inverter being connected between a gate of the first switch, an input of said inverter being connected to a connecting point between the capacitance element and the resistance element.

2. The protection circuit according to claim 1, further comprising a second switch provided between the signal line and the first power supply,
wherein the capacitance element is connected to a gate of the second switch and the first power supply.

* * * * *